(12) United States Patent
Na

(10) Patent No.: US 6,446,354 B1
(45) Date of Patent: Sep. 10, 2002

(54) HANDLER SYSTEM FOR CUTTING A SEMICONDUCTOR PACKAGE DEVICE

(75) Inventor: Ik-gyun Na, Incheon-shi (KR)

(73) Assignee: Hanmi Co., Ltd., Incheon-shi (KR)

( * ) Notice: Subject to any disclaimer, the term of this patent is extended or adjusted under 35 U.S.C. 154(b) by 0 days.

(21) Appl. No.: 09/834,557

(22) Filed: Apr. 13, 2001

(30) Foreign Application Priority Data

Dec. 20, 2000 (KR) ......................................... 2000-79282
Dec. 20, 2000 (KR) ......................................... 2000-79284

(51) Int. Cl.[7] ............................. F26B 19/00; H01L 21/00
(52) U.S. Cl. ............................. 34/236; 34/60; 134/902; 438/7
(58) Field of Search ..................... 34/60, 236; 134/902; 438/7

(56) References Cited

U.S. PATENT DOCUMENTS

| 5,232,463 | A | | 8/1993 | Micic et al. | |
|---|---|---|---|---|---|
| 5,335,702 | A | | 8/1994 | Goto | |
| 5,446,584 | A | * | 8/1995 | Bacchi | 359/393 |
| 5,654,204 | A | * | 8/1997 | Anderson | 438/15 |
| 5,679,055 | A | * | 10/1997 | Greene et al. | 451/10 |
| 5,766,360 | A | * | 6/1998 | Sato et al. | 118/666 |
| 5,803,972 | A | * | 9/1998 | Sato et al. | 118/712 |
| 5,824,185 | A | * | 10/1998 | Nakamura et al. | 156/584 |
| 5,897,710 | A | * | 4/1999 | Sato et al. | 427/8 |
| 6,036,582 | A | * | 3/2000 | Aizawa et al. | 451/41 |
| 6,137,303 | A | * | 10/2000 | Deckert et al. | 324/765 |
| 6,281,510 | B1 | * | 8/2001 | Yoshitake et al. | 250/492.2 |
| 6,301,801 | B1 | * | 10/2001 | Kato et al. | 34/406 |
| 6,305,898 | B1 | * | 10/2001 | Yamagishi et al. | 414/744.5 |
| 6,314,658 | B2 | * | 11/2001 | Kato et al. | 34/406 |

* cited by examiner

*Primary Examiner*—Ira S. Lazarus
*Assistant Examiner*—K. B. Rinehart
(74) *Attorney, Agent, or Firm*—John P. White; Cooper & Dunham LLP

(57) ABSTRACT

A handler system is provided with an on-loader unit for loading at least one of strips deposited in a cassette, a drawer unit for holding the strip from the on-loader unit at a drawer picker, a strip transferring unit for fixing in a suction manner after the holding its picker head and for transferring the strip to a cutting device, cut it into a plurality of individual package devices, a package cleaning unit for cleaning the individual package devices using a brush and an air nozzle after to fixing and retaining the individual package devices thereon by using a suction vacuum force, a package drying unit for drying the individual package devices after the cleaning, a package deposit unit for moving and depositing after drying, a package pick-up unit for retaining and for arranging the individual package devices for a quality inspection, the package pick-up unit mounted on one side of the package deposit unit, a visual inspection means for inspecting the quality of the individual package devices being, and a package tray deposit unit for retaining the individual package devices C thereon by using the suction vacuum force to seat the individual package devices on the package deposit unit, the package tray deposit unit for transferring the tray on which the individual package devices classified based on the inspection result are contained.

16 Claims, 24 Drawing Sheets

HANDLER SYSTEM FOR CUTTING A SEMICONDUCTOR PACKAGE DEVICE

FIELD OF THE INVENTION

The present invention relates to a handler system for cutting a semiconductor package device, for transferring and for depositing the same and, more particularly, to a handler system for cutting a semiconductor package device a semi-finished product on which a plurality of packages are arranged and strips are easily cut by a cutting device, e.g., a sawing machine, and wherein a quality inspection is performed to find an inferior one after each of the separated package devices is cleaned and dried, so that the package devices can be separately deposited on a basis of the inspection result, whereby the manufacturing of the semiconductor package device is efficiently processed.

DESCRIPTION OF THE PRIOR ART

In general, a semiconductor package device is manufactured in such a manner that a plurality of lead frames protruding outside a package are bent through processes, i.e., trimming, forming and a singulation and then a plurality of separated package devices are obtained by cutting the lead frames integrally connected to the strip.

Developments of information and communication technology in recent days requires a semiconductor device having a higher degree of integration. Further, a package device having a BGA(Ball Grid Array) is widely used in recent days, in stead of a package device having a lead frame for connecting an inner lead and an outer lead to each other. In this case, an electronic circuit of a high degree of integration, e.g., a transistor and a capacitor, is established on the wafer and then this is cut into a plurality of individual single chips by the sawing machine and then the chips are coated to be a separate package device.

In accordance with the prior art package cutting device, the packages arranged on the strip are placed on a pre-adjusted jig to be fixed thereto and then cut into a plurality of individual separated packages. In a case that cleaning process is required due to a dirt or a remaining material after the cutting process and that a quality inspection process is required, those processes are performed by transferring the jig itself which holds the packages.

In the prior art devices or systems, however, since the jig is transferred for a cutting process, a cleaning process or a quality inspection process, overall system not only becomes complicated, increasing the manufacturing cost and space requirement for the device but also has a reduced productivity in manufacturing the packages.

SUMMARY OF THE INVENTION

It is, therefore, a primary object of the invention to provide a handler system wherein a semi-finished product on which a plurality of packages are arranged and strips are easily cut by a cutting device, e.g., a sawing machine, and wherein a quality inspection is performed to find an inferior one after each of the separated package devices is cleaned and dried, so that the package devices can be selectively deposited on a basis of the inspection result, whereby the manufacturing of the semiconductor package device is efficiently processed.

In order to achieve the object, the present invention provides a handler system for cutting semiconductor package devices in a manner to selectively deposit the package devices according to a quality of the package devices, comparing with a predetermined quality grade, after individual single package device is obtained by cutting a semi-finished product of a semiconductor or a strip in a cutting device, the system comprising: an on-loader unit for loading at least one of strips deposited in a cassette; a drawer unit for holding the strip from the on-loader unit at a drawer picker; a strip transferring unit for fixing in a suction manner the strip held by the drawer unit to its picker head for transferring the strip to a cutting device in which the strip is cut into a plurality of individual package devices; a package cleaning unit for cleaning the individual package devices using a brush and an air nozzle after a picker head for fixing the individual package devices retaining the individual package devices thereon by using a suction vacuum force; a package drying unit for drying the individual package devices after the individual package devices are cleaned by the cleaning unit; a package transferring unit for vacuum absorbing and moving the individual package devices dried by the package drying unit; a package deposit unit for moving and depositing the individual package devices transferred by the package transferring unit; a package pick-up unit for retaining the individual package devices thereon by using the suction vacuum force and for arranging the individual package devices for a quality inspection of the individual package devices, the package pick-up unit mounted on one side of the package deposit unit; a visual inspection means for inspecting the quality of the individual package devices being retained on a pick-up head of the package pick-up unit; and a package tray deposit unit for retaining the individual package devices C thereon by using the suction vacuum force to seat the individual package devices on the package deposit unit, the package tray deposit unit for transferring the tray on which the individual package devices classified based on the inspection result are contained.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

A preferred embodiment of the present invention is described with reference to accompanying drawers.

Figure 1A:
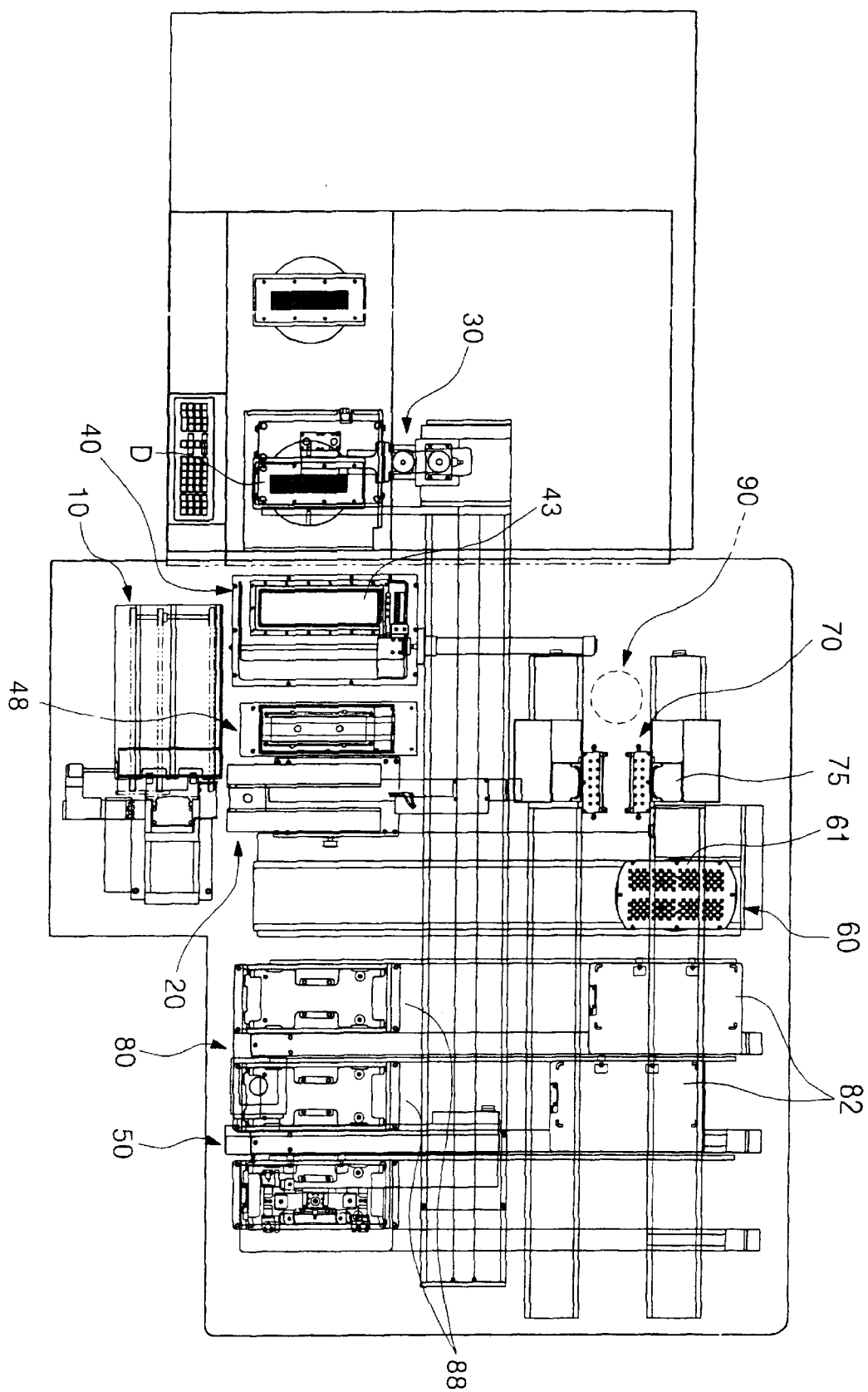
FIG. 1a illustrates a top planar view of an inventive handler system for cutting a semiconductor package device.
Figure 1B:
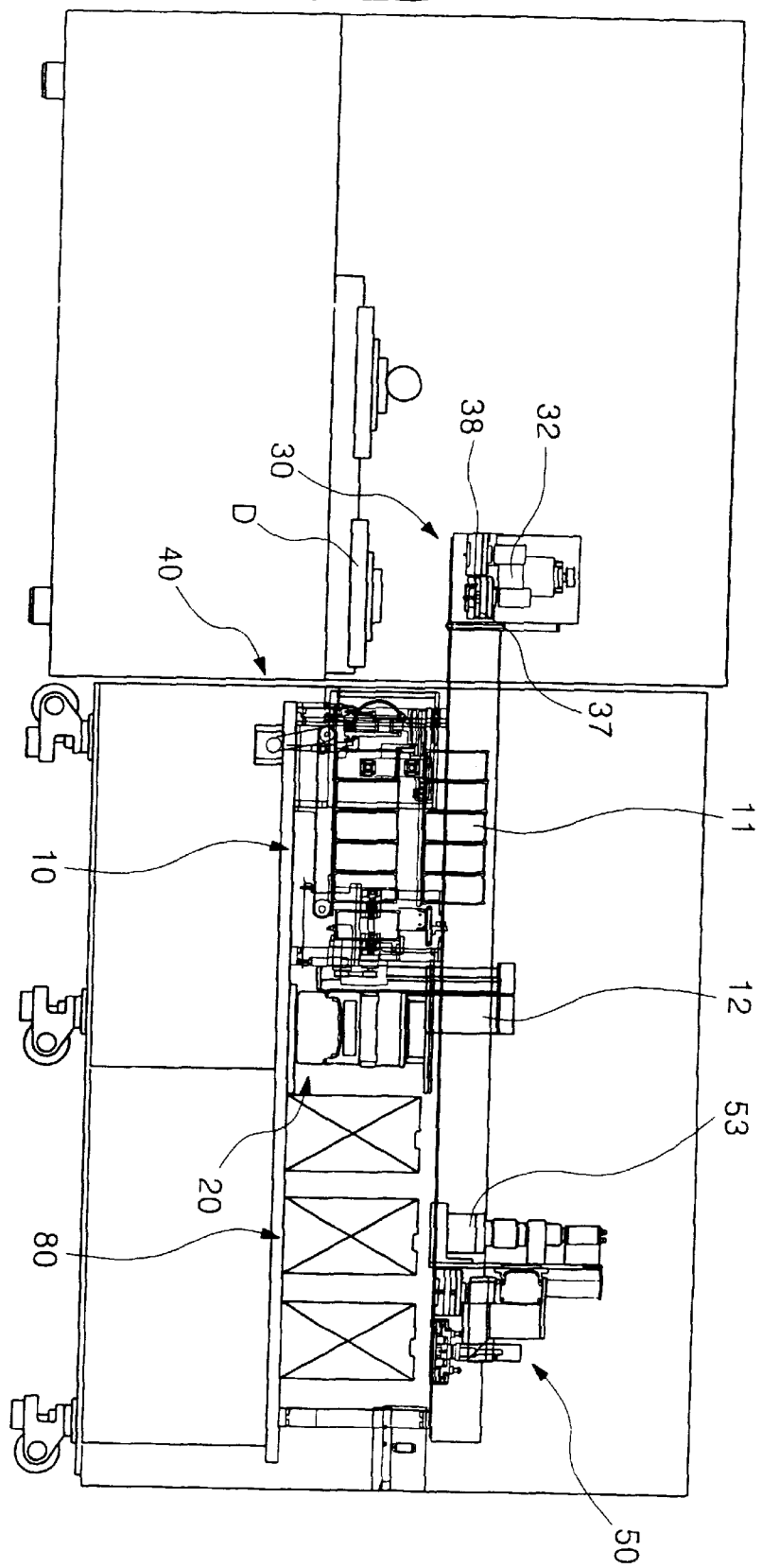
FIG. 1b shows a frontal view of the inventive handler system for cutting a semiconductor package device.
Figure 1C:
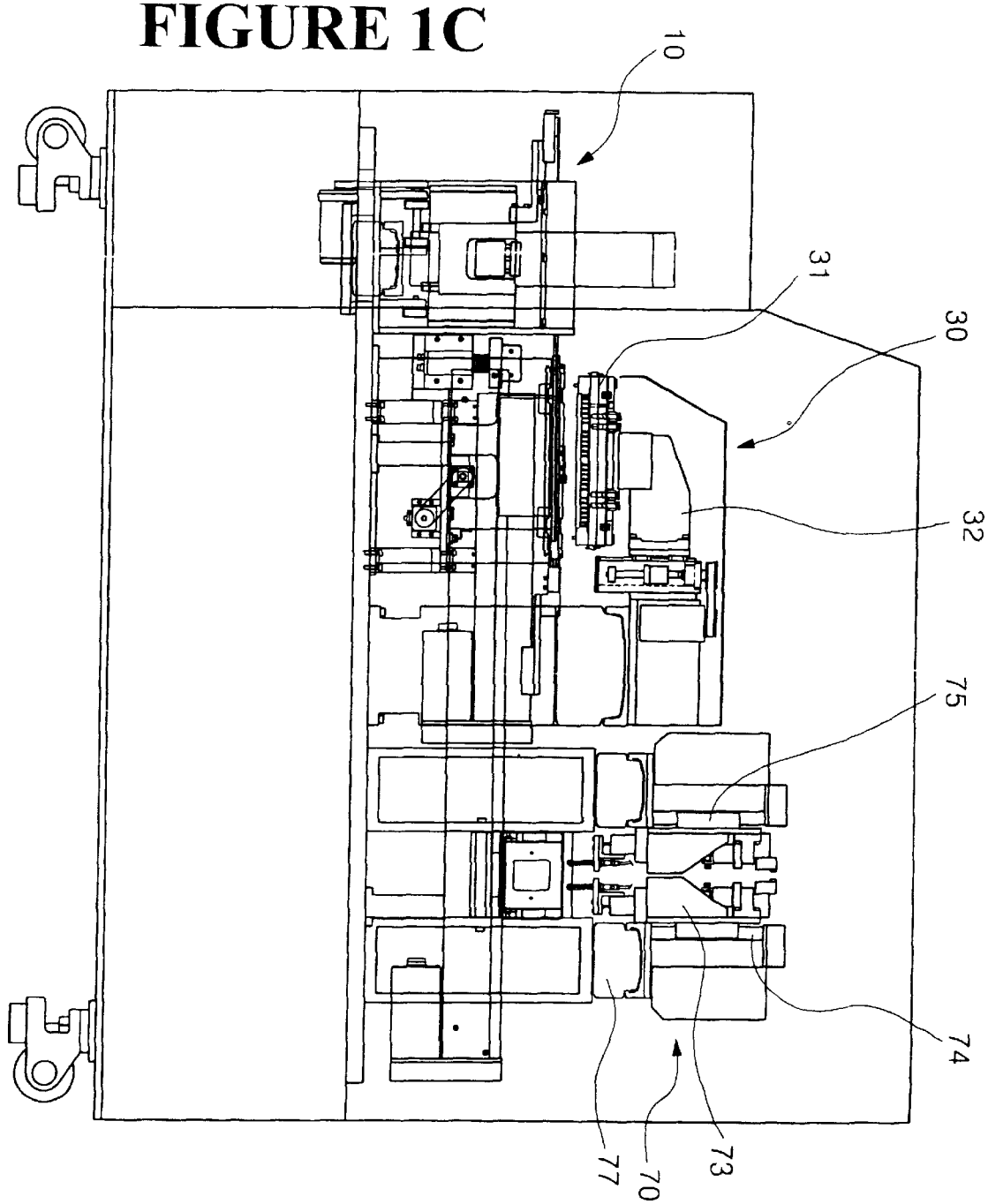
FIG. 1c shows a right-side elevational view of the inventive handler system for cutting a semiconductor package device.
Figure 2A:
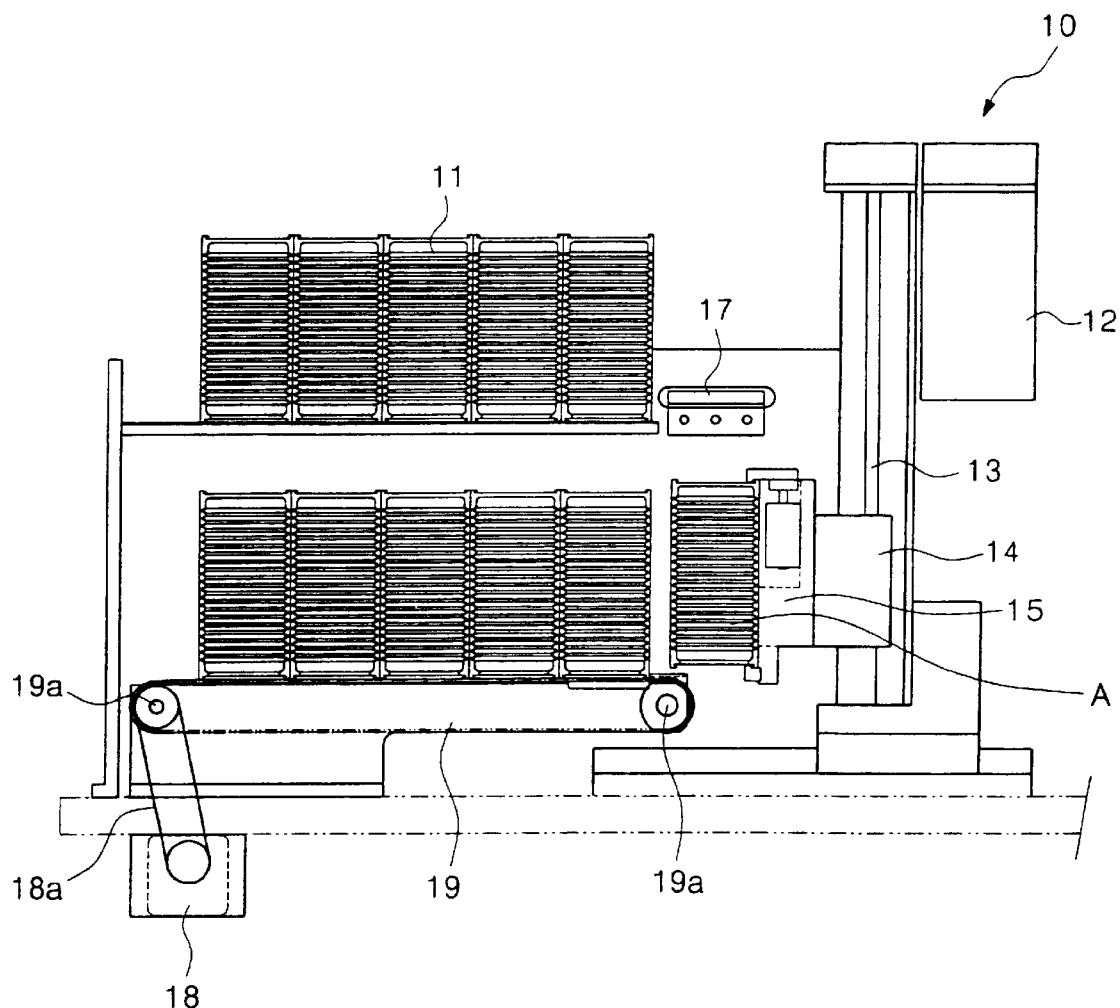
FIG. 2a depicts a frontal view of an on-loader unit in accordance with the present invention.
Figure 2B:
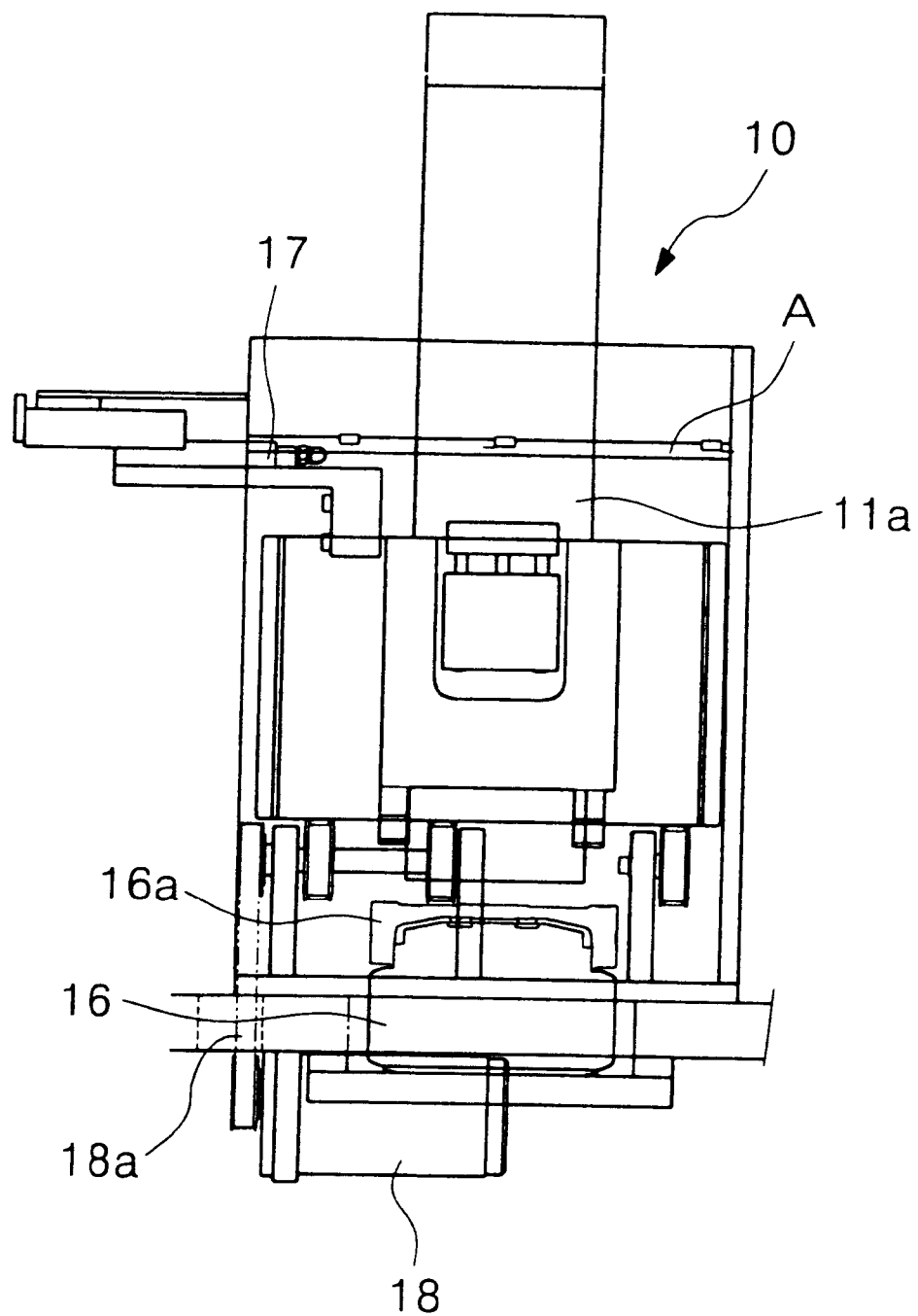
FIG. 2b depicts a right-side elevational view of the on-loader unit in accordance with the present invention.
Figure 3A:
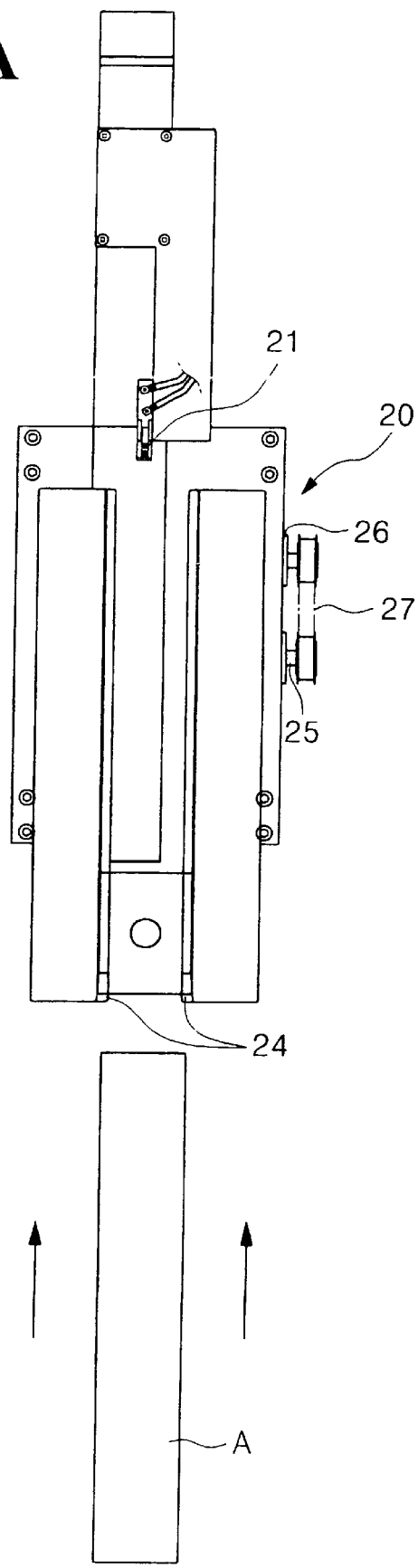
FIG. 3a depicts a top planar view of a drawer unit in accordance with the present invention.
Figure 3B:
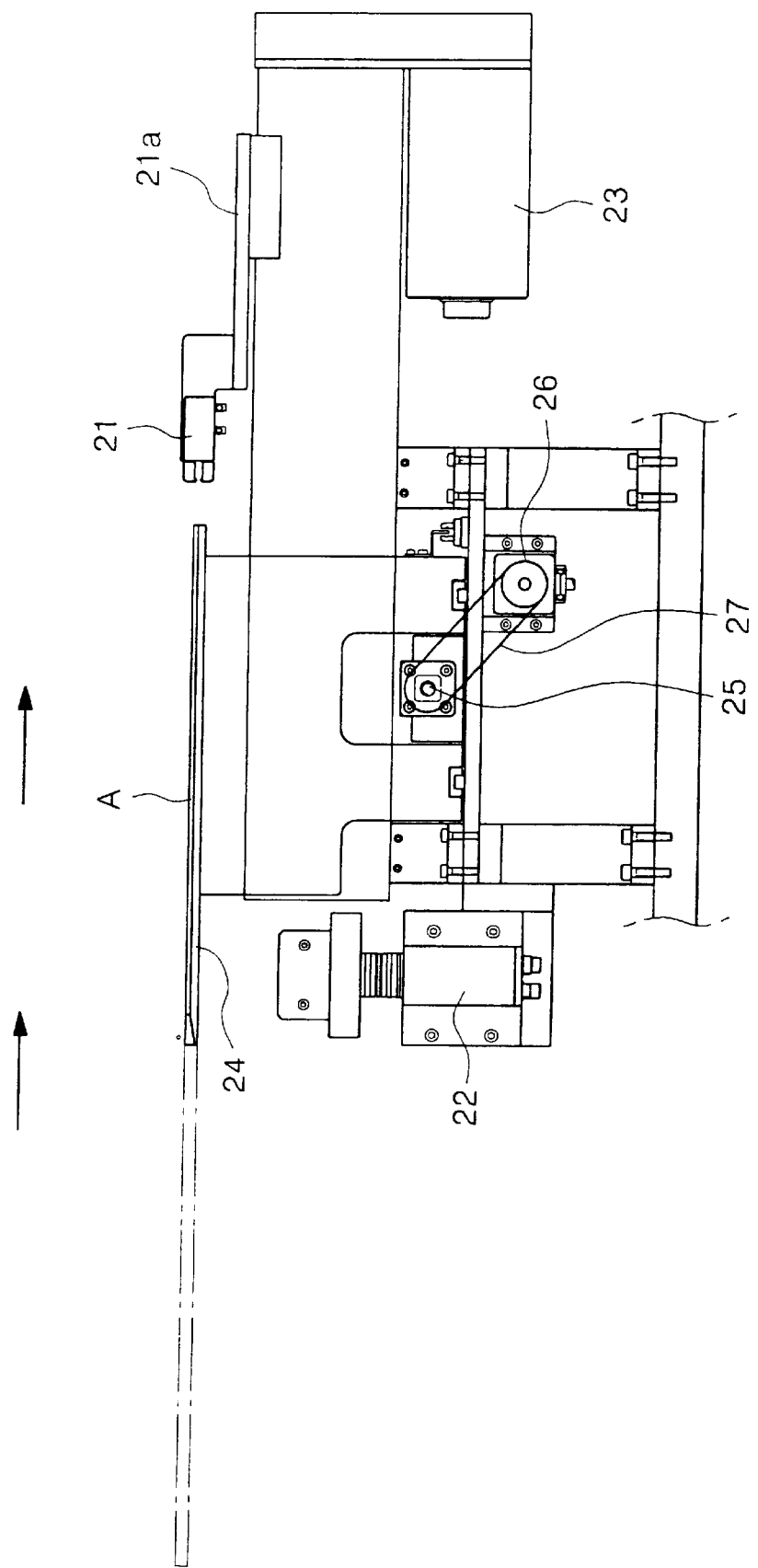
FIG. 3b depicts a right-side elevational view of the drawer unit in accordance with the present invention.
Figure 4A:
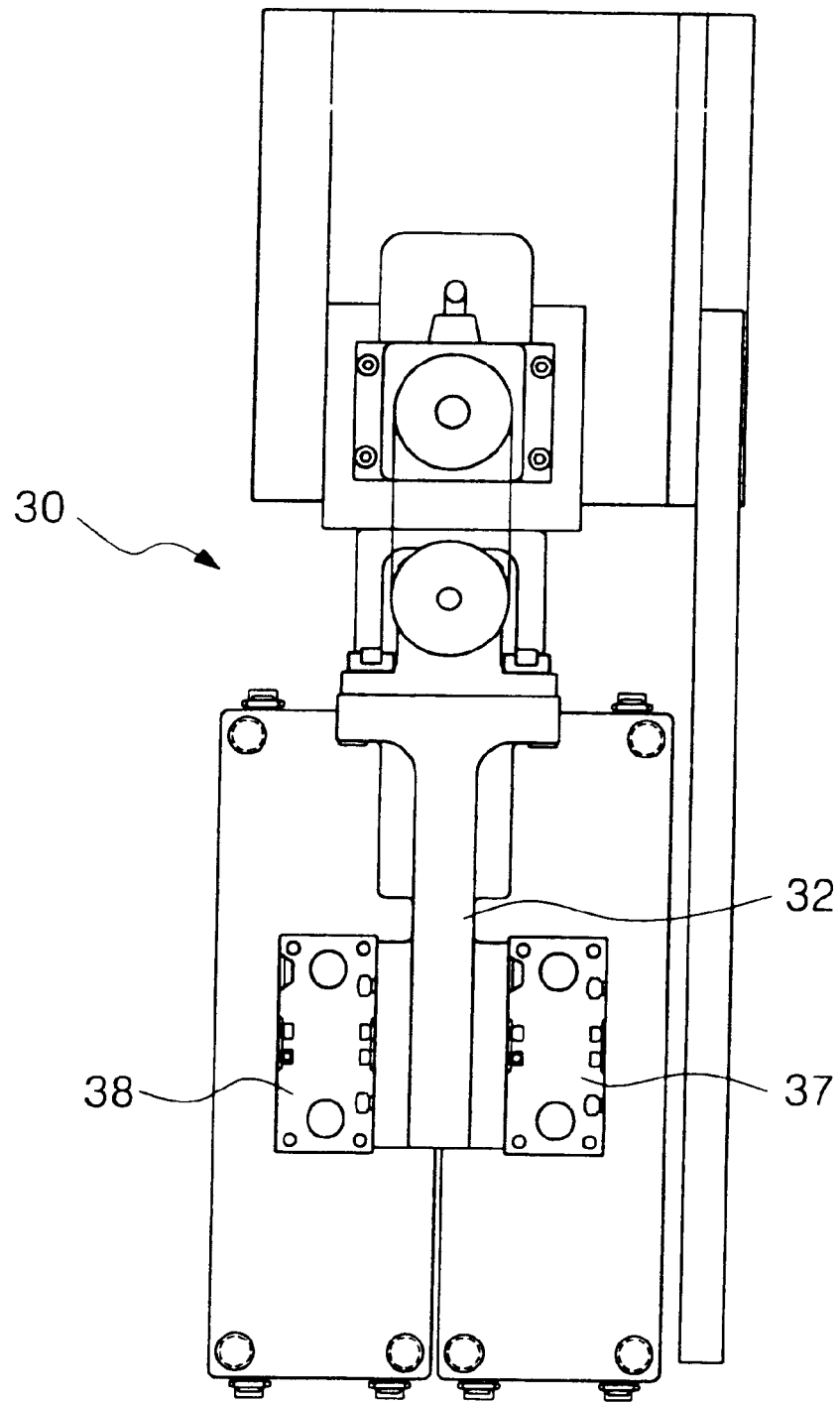
FIG. 4a depicts a top planar view of a pick-up unit for transferring semi-finished products in accordance with the present invention.
Figure 4B:
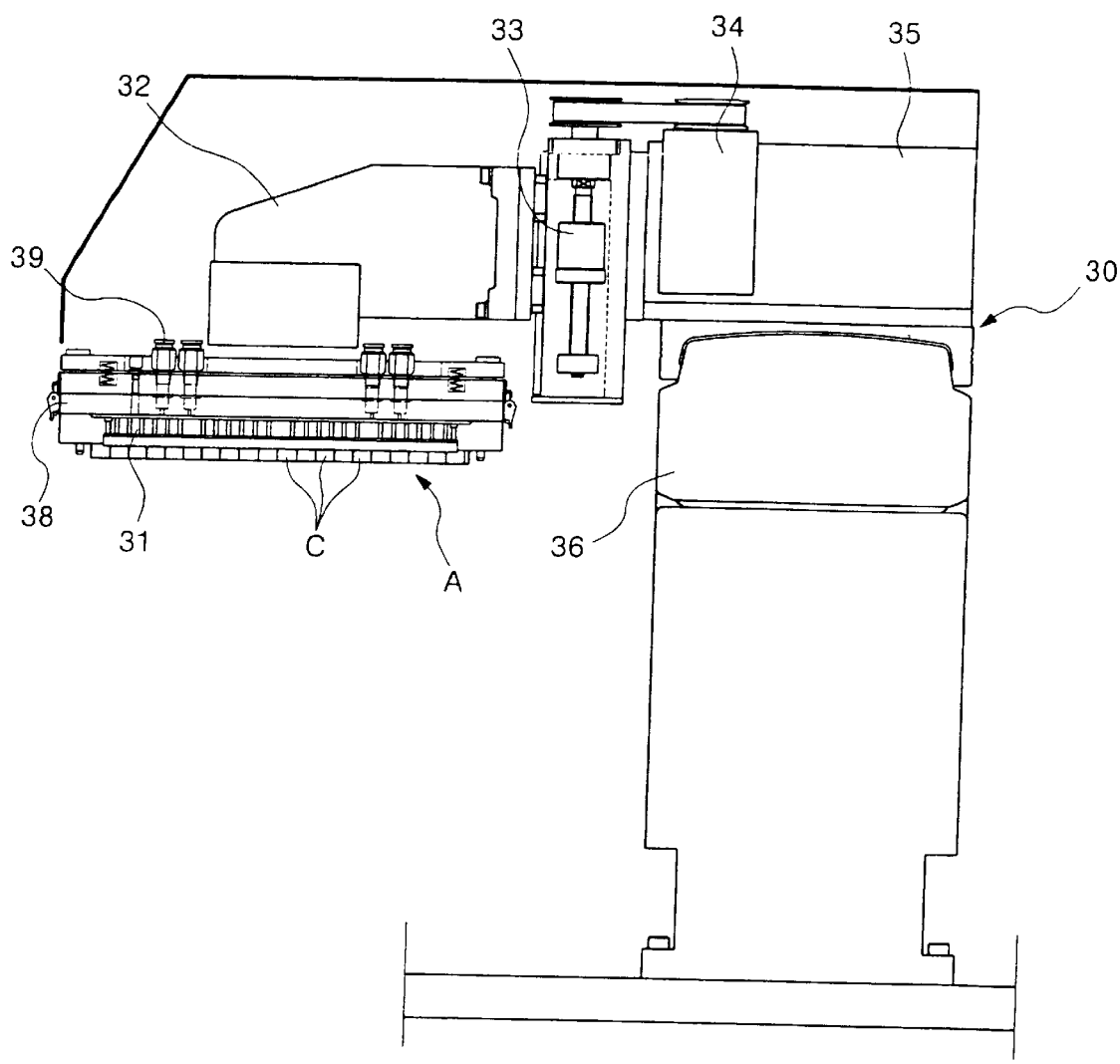
FIG. 4b depicts a right-side elevational view of the pick-up unit for transferring semi-finished products in accordance with the present invention.
Figure 5A:
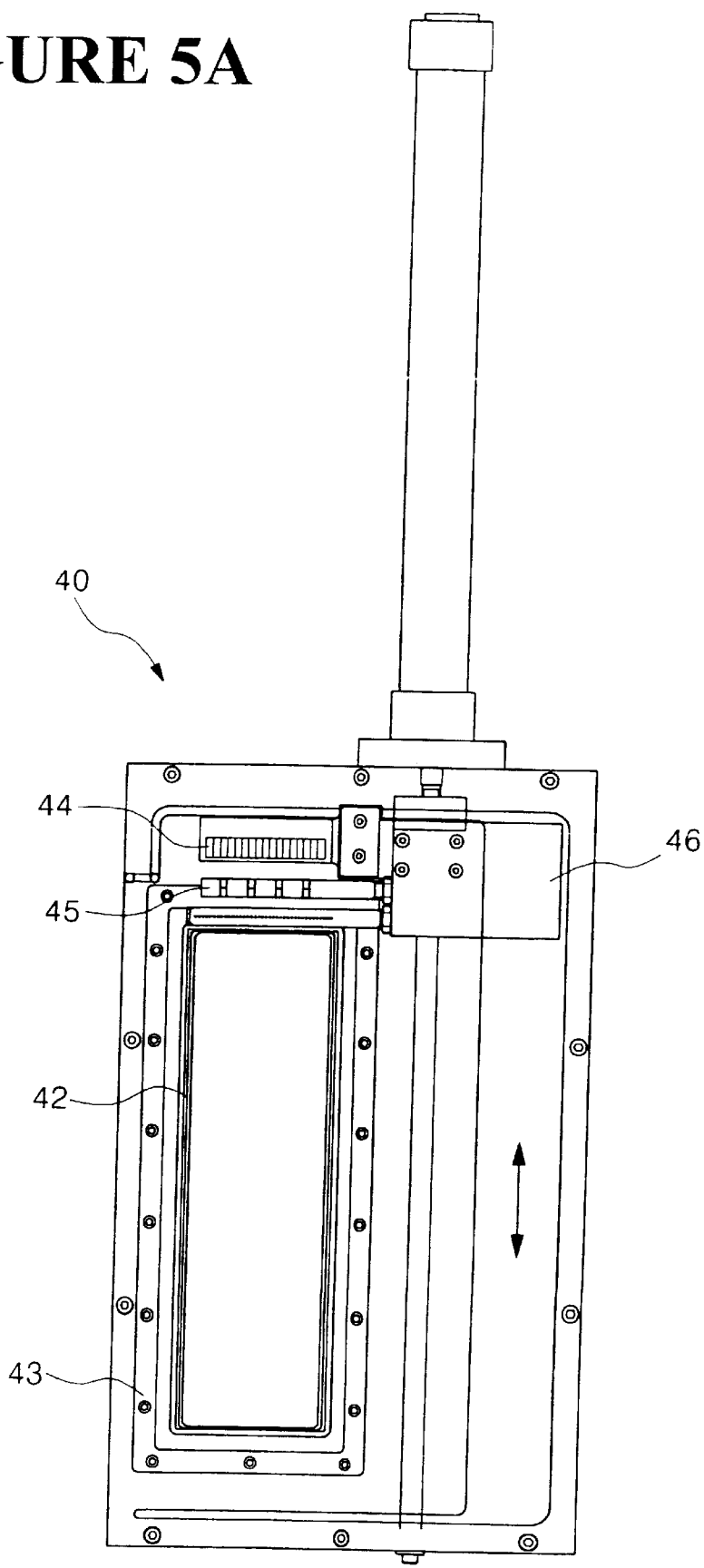
FIG. 5a presents a top planar view of a cleaning unit in accordance with the present invention.
Figure 5B:
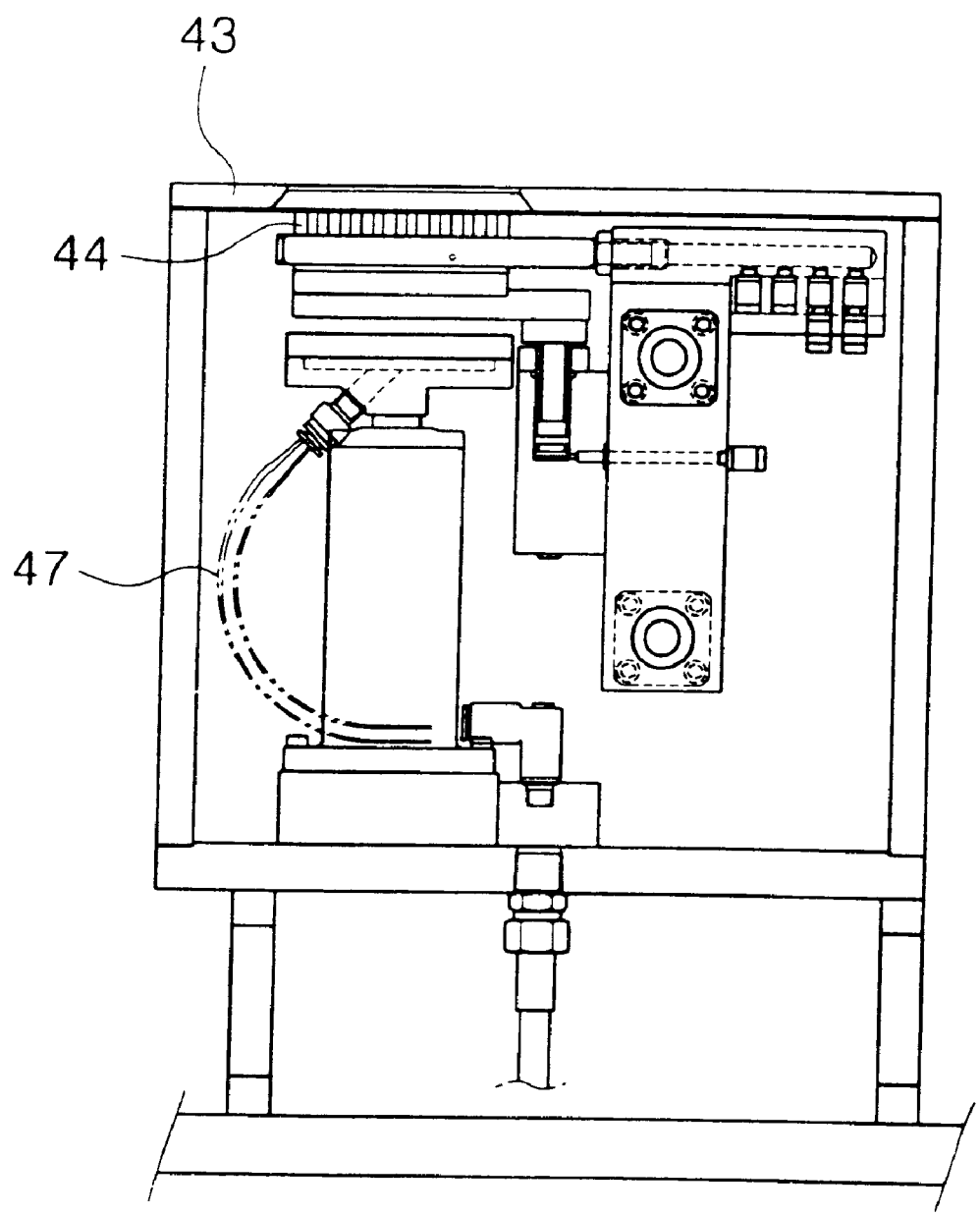
FIG. 5b presents a right-side elevational view of the cleaning unit in accordance with the present invention.
Figure 6:
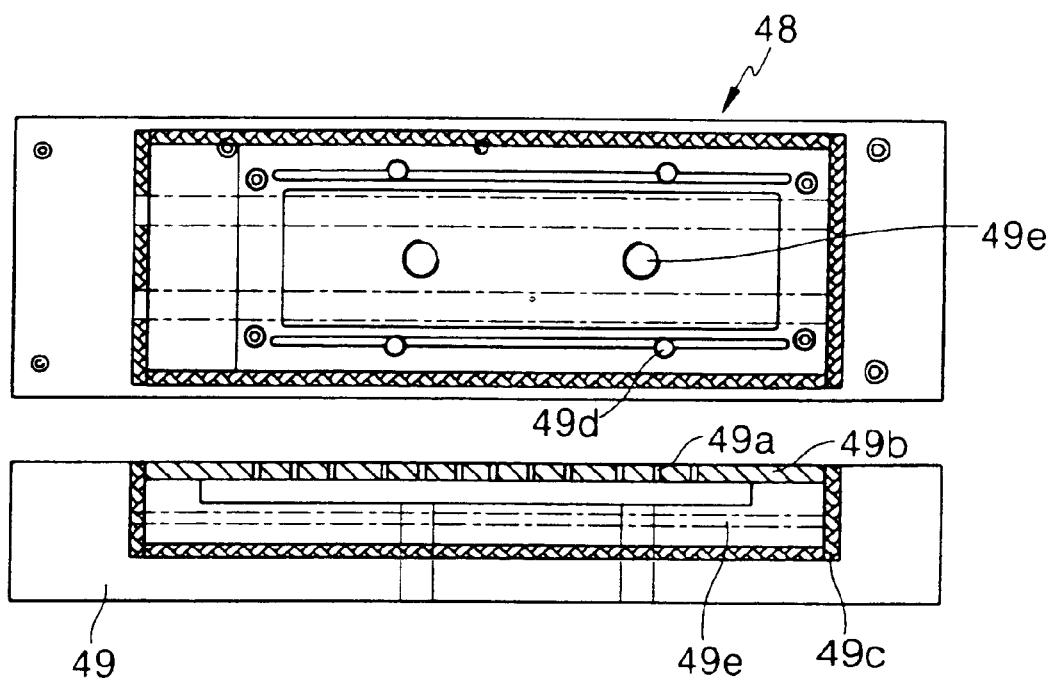
FIG. 6 illustrates a drying unit in accordance with the present invention.
Figure 7A:
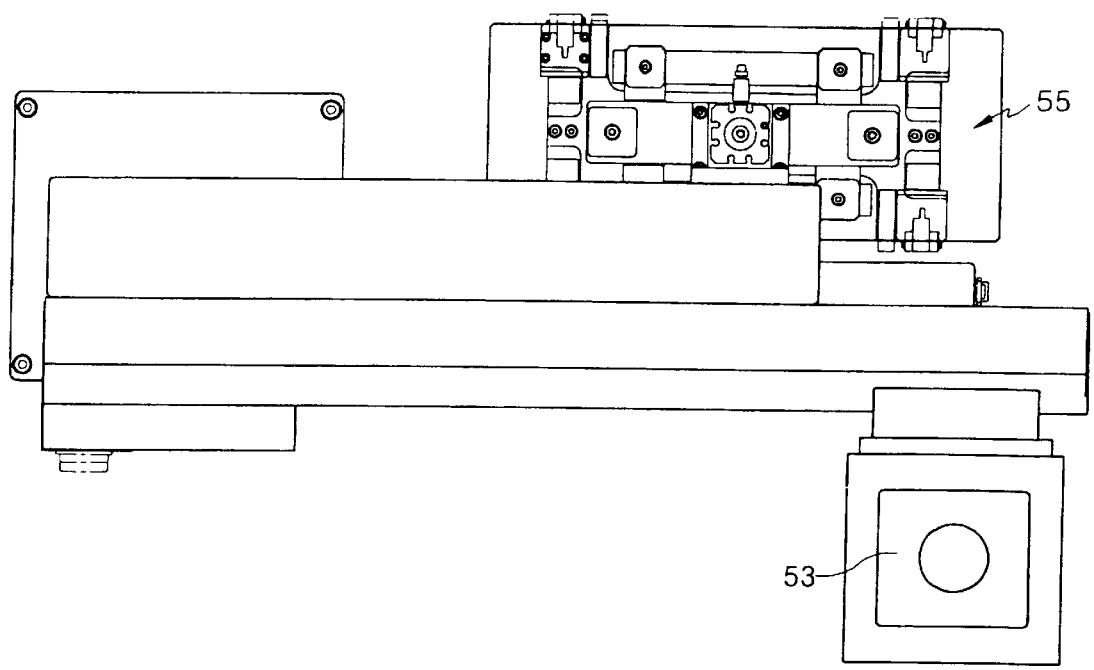
FIG. 7a shows a top planar view of a package transferring unit in accordance with the present invention.
Figure 7B:
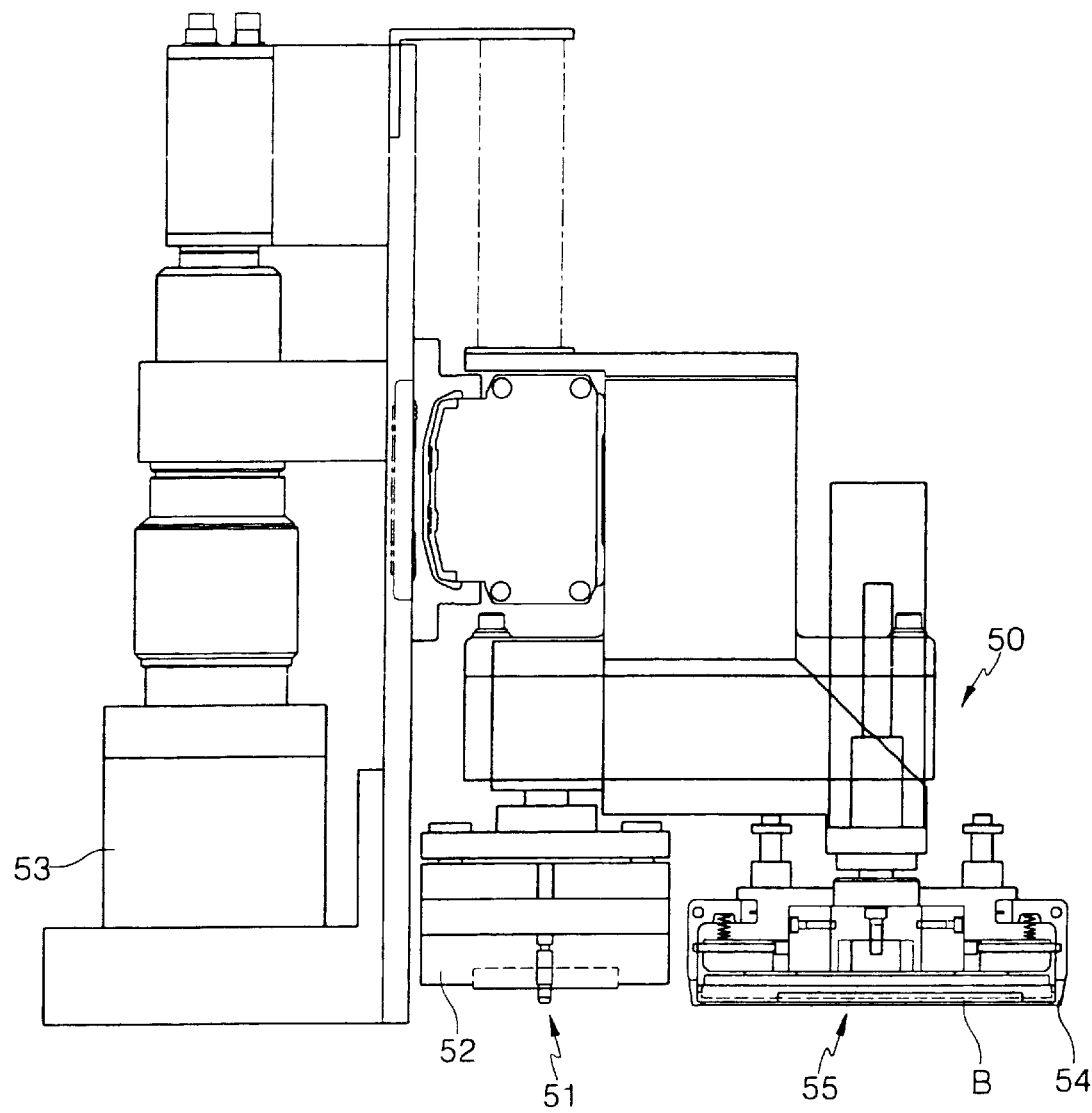
FIG. 7b shows a right-side elevational view of the package transferring unit in accordance with the present invention.
Figure 9A:
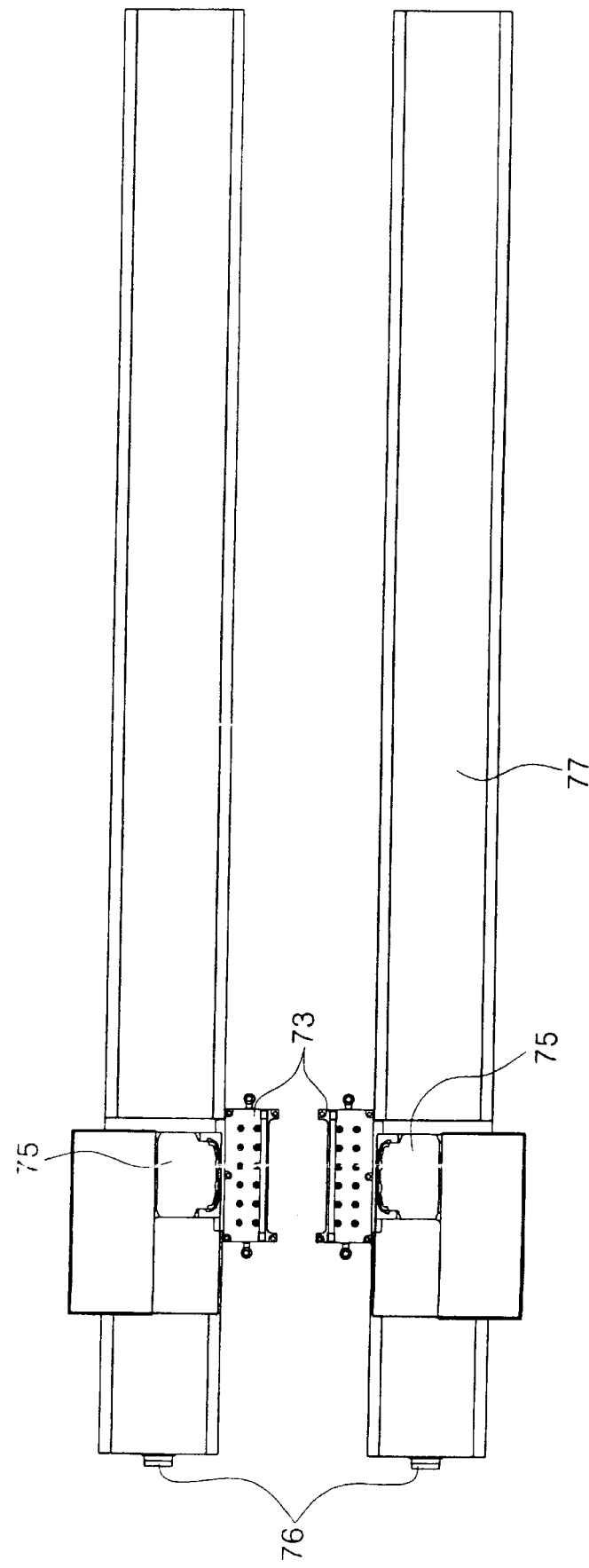
FIG. 9a illustrates a top planar view of a package pickup unit in accordance with the present invention.
Figure 9B:
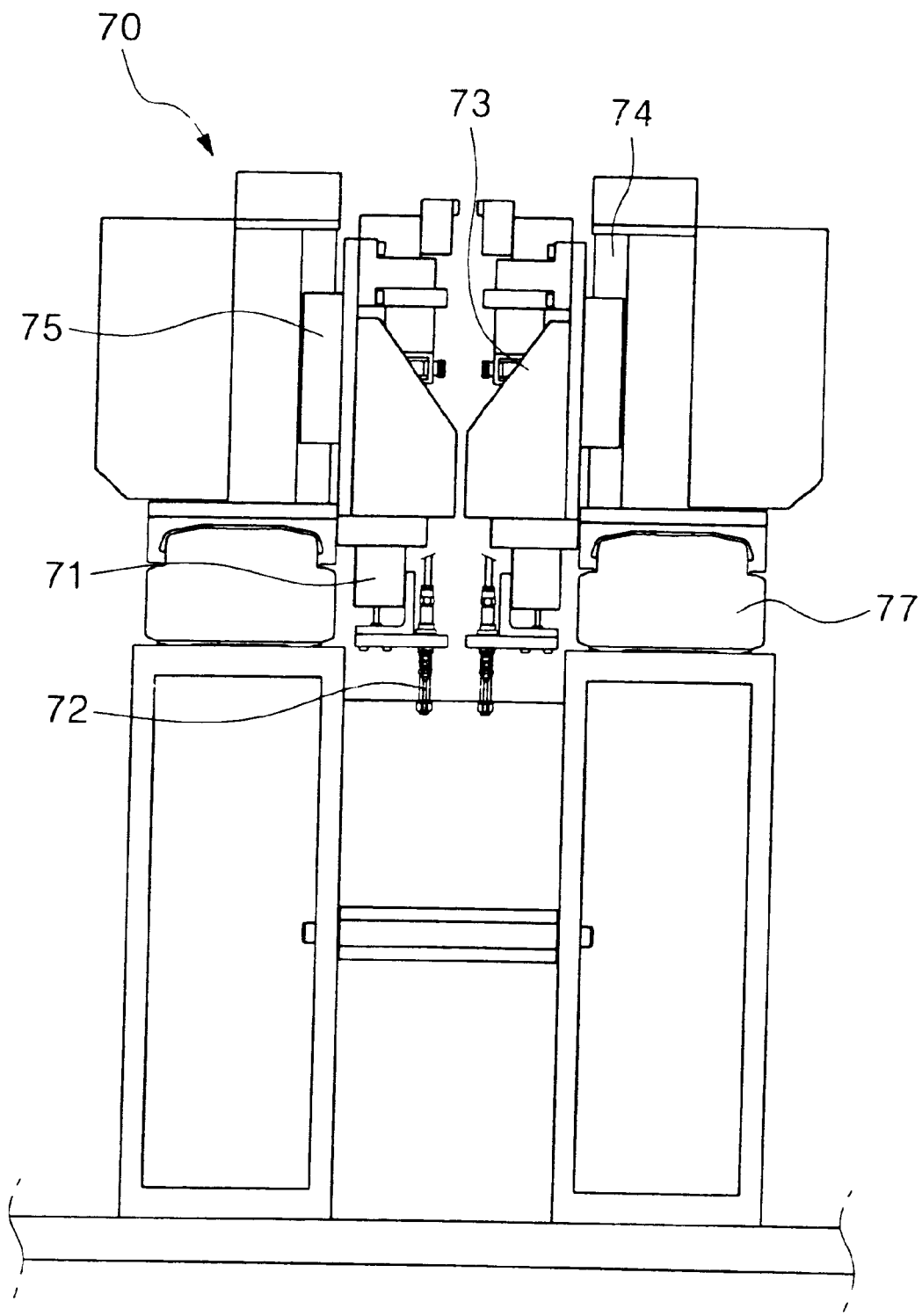
FIG. 9b illustrates a right-side elevational view of the package pick-up unit in accordance with the present invention.
Figure 10A:
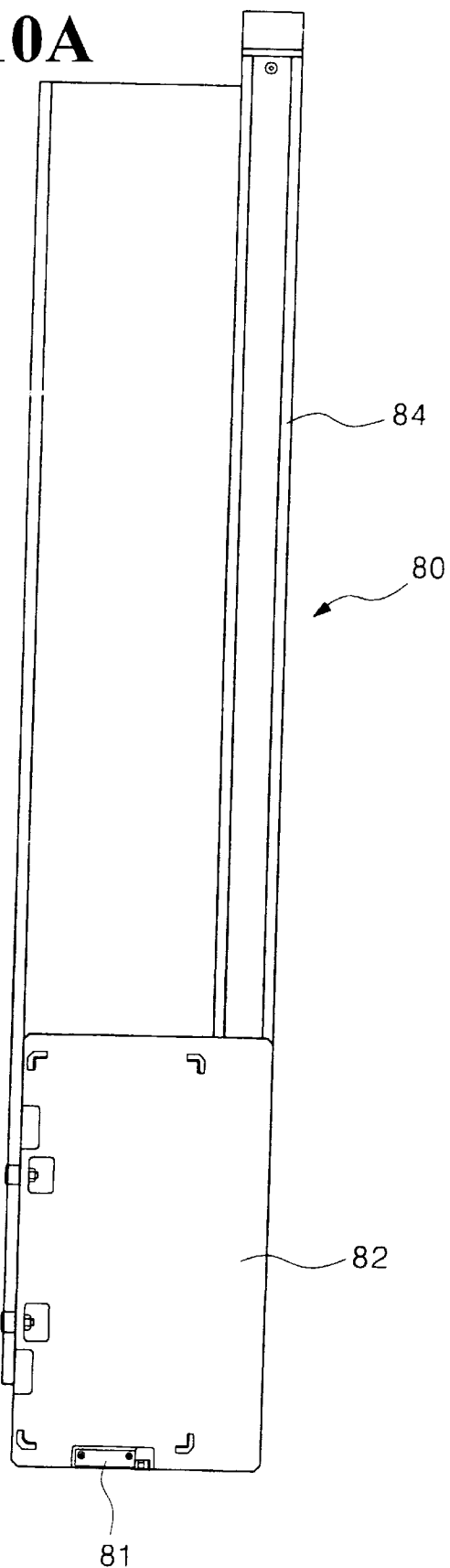
FIGS. 10a and 10b show a top planar view and a right-side elevational view of a package tray deposit unit in accordance with the present invention, respectively.
Figure 10B:
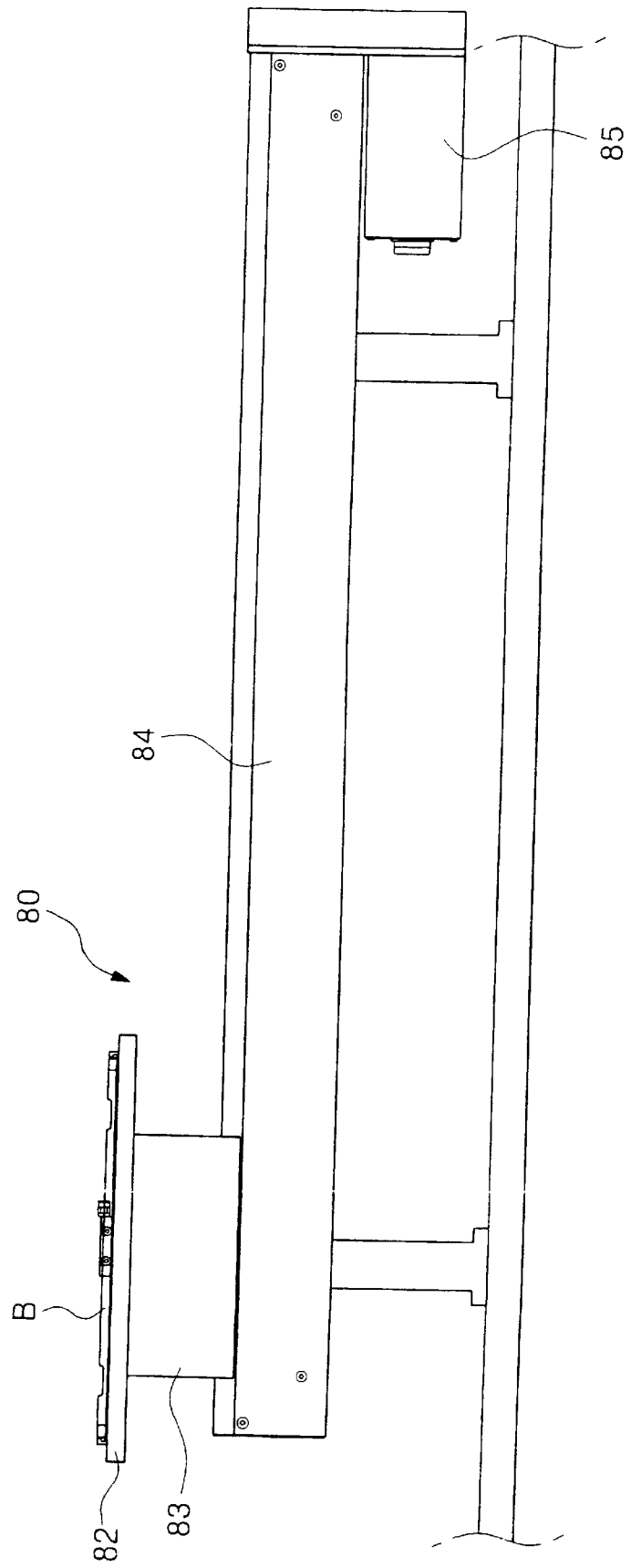
Figure 10C:
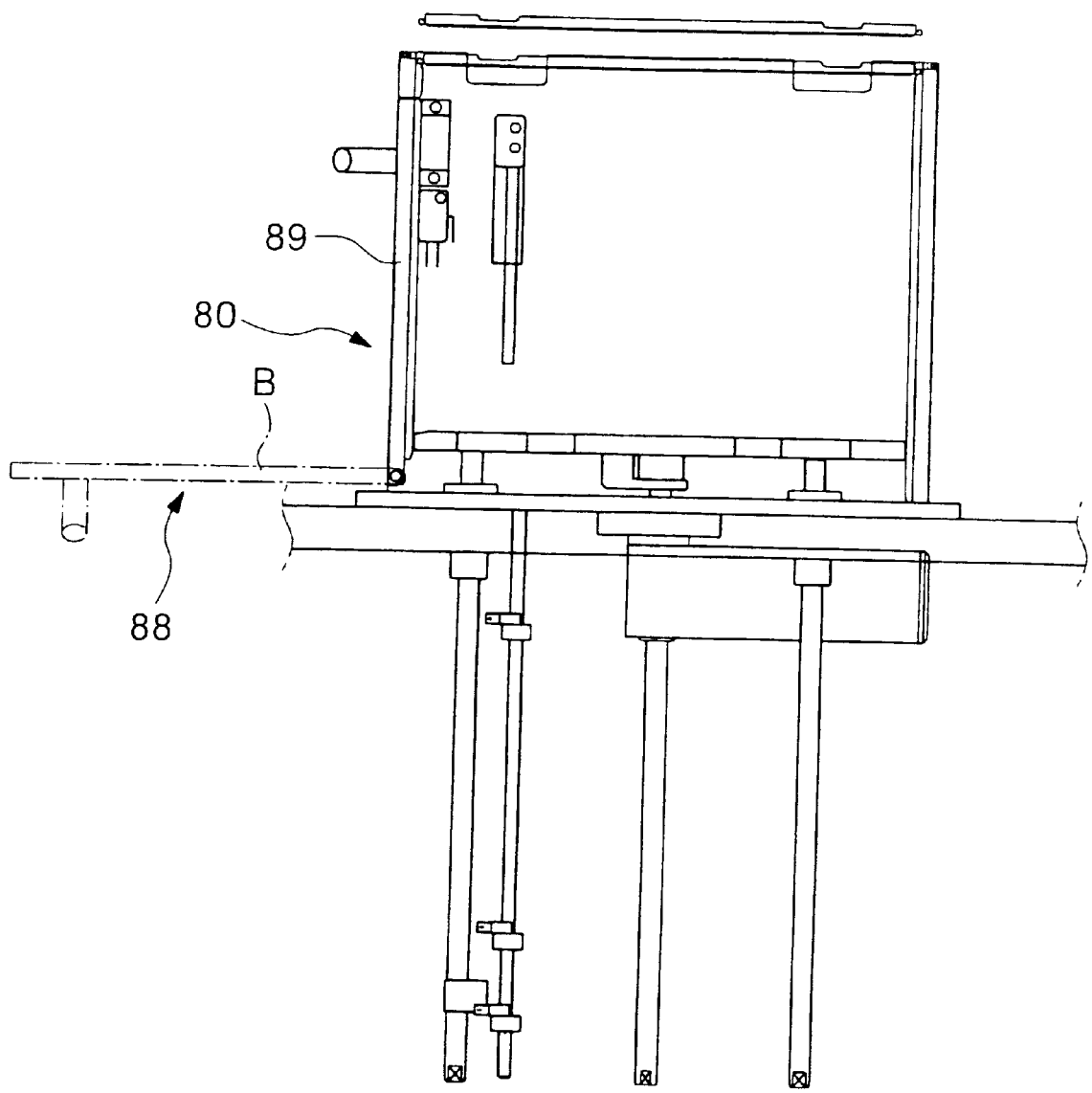
FIG. 10c depicts a tray deposit portion of the package tray deposit unit.

FIGS. 1a through 1c illustrate an inventive handler system for cutting a semiconductor package device; FIGS. 2a and 2b depict an on-loader unit in accordance with the present invention; FIGS. 3a and 3b depict a drawer unit in accordance with the present invention; FIGS. 4a and 4b depict a pick-up unit for transferring semi-finished products in accordance with the present invention; FIGS. 5a and 5b present a cleaning unit in accordance with the present invention; FIG. 6 illustrates a drying unit in accordance with the present invention; FIGS. 7a and 7b show a package transferring unit in accordance with the present invention; FIGS. 8a through 8g depict a package deposit unit in accordance with the present invention; FIGS. 9a and 9b illustrate a package pick-up unit in accordance with the present invention; and FIGS. 10a to 10c show a package tray deposit unit in accordance with the present invention.

The inventive handler system for cutting the semiconductor package device, as shown in FIGS. 1a to 1c, deposits the package devices in a manner to selectively deposit the package devices according to a quality of the package devices, comparing with a predetermined quality grade, after individual single package device is obtained by cutting a semi-finished product of a semiconductor or a strip in a cutting device. The inventive handler system comprises an on-loader unit 10a for loading at least one of strips A deposited in a cassette 11; a drawer unit 20 for holding the strip A from the on-loader unit at a drawer picker 21; a strip transferring unit 30 for fixing in a suction manner the strip A held by the drawer unit 20 to its picker head 37 for transferring the strip to a cutting device D in which the strip A is cut into a plurality of individual package devices C; a package cleaning unit 40 for cleaning the individual package devices using a brush 44 and an air nozzle 45 after a picker head 38 for fixing the individual package devices C retaining the individual package devices thereon by using a suction vacuum force; a package drying unit 48 for drying the individual package devices after the individual package devices C are cleaned by the cleaning unit 40; a package deposit unit 60 for moving and depositing the individual package devices dried by the package drying unit 48; a package pick-up unit 70 for retaining the individual package devices thereon by using the suction vacuum force and for arranging the individual package devices for a quality inspection of the individual package devices, the package pick-up unit 70 mounted on one side of the package deposit unit 50; and a visual inspection means 90 for inspecting the quality of the individual package devices C being retained on a pick-up head 72 of the package pick-up unit 70; and a package tray deposit unit 80 for retaining the individual package devices C thereon by using the suction vacuum force to seat the individual package devices C on the package deposit unit 60, the package tray deposit unit 80 for transferring the tray B on which the individual package devices classified based on the inspection result are contained.

As shown in FIGS. 2a and 2b, the on-loader unit 10a includes a finger 15 for holding the cassette at both ends of the cassette 11; a conveyor belt 19 being rotated by a rotating shaft 19a to horizontally move the cassette 11; a motor 18 being coupled to the rotating shaft 19a via a belt 18a; an elevating motor 12 for rotating a screw 13 engaged with a nut 14 to vertically move the finger 15 relative to a fixed shaft 11a; a guiding member 16a and a guiding rail 16 for horizontally moving the cassette held by the finger 15; and a strip pusher 17 for pushing the strip A deposited on the cassette 11 toward the drawer picker 21 of the drawer unit 20.

As shown in FIGS. 3a and 3b, the drawer unit 20 includes a pair of guiding rails 24 for guiding both sides of the strip A being moved by the drawer picker 21 retaining the strip A; a width adjusting screw shaft 25 for adjusting a width between the rails 24; a guiding member 21a supporting the drawer picker 21 and transferring the same to a position of a strip pick-up; and a motor 23 for guiding the movement of the guiding member 21a to guide the drawer picker 21.

As shown in FIGS. 4a and 4b, the strip transferring unit 30 includes a suction portion 31 formed with the pair of picker heads 37, 38 for retaining thereon the strip A before the cutting process and the individual package devices, respectively, by a suction vacuum force; a vacuum port 39 for providing the suction portion 31 with a vacuum pressure; a picker transferring member 32 for vertically moving the suction portion 31 to allow the suction portion 31 to be closely contacted on the strip A; and a reciprocating transferring member 35 for horizontally reciprocally moving each of the individual package devices separated by cutting the strip A retained on the suction portion 31 of the picker head 38 by the cutting device D.

As shown in FIGS. 5a and 5b, the package cleaning unit 40 includes an upper plate 43 on which the package devices C retained on the picker head 38 of the strip transferring unit 30 are seated; an air pipe 47 for emitting an air to the package devices seated on the upper plate 43 through an air nozzle 45; and the transfer block 46 having a power means for horizontally moving the brush 44 and the transfer block 46.

It is preferable that an O-ring 42 is formed along an edge in order to absorb a shock occurring when the packaged device is seated on the upper plate 43.

As shown in FIG. 6, the package drying unit 48 includes an upper plate 49b on which the package device from which alien material is removed in the package cleaning unit 40 is seated to be retained by a suction force through a vacuum suction hole 49d; a heating member 49c mounted between the upper plate 49b and a main body 49 of the drying unit to heat at a high temperature the package device C retained on the upper plate 49b by the vacuum suction force; and a vacuum path 49e for applying a vacuum of a high negative pressure to the package device C retained on the upper plate 49 by the suction force to remove the humidity from the package device C.

As shown in FIGS. 7a and 7b, the package transferring unit 50 includes a package pick-up portion 51 for picking up the package device C by using a pick-up head 52, from which the alien material is removed in the cleaning unit 40 and the drying unit 48; and a tray pick-up portion 55 for holding the tray B using a tray clamp 54 to supply the tray B on which the plurality of the package devices picked up by the package pick-up portion 51.

The package quality inspection means 53 for inspecting the quality of the package devices is mounted on one side of the package transferring unit 50.

As shown in FIGS. 8a to 8g, the package deposit unit 60 includes a package deposit table 61 on which the package devices C are captured by a vacuum suction force and deposited in a separation therebetween; a plurality of vacuum pipes 64 being connected to a vacuum source beneath the package deposit table 61 to provide a high vacuum pressure; a transferring portion 65 supporting a lower surface of the package deposit table 61 and having a nut 66 at its lower portion; a screw shaft 67 being coupled to the nut 66 and being rotated by a driving motor 69 to horizontally transfer the transferring portion 65 to a predetermined position; and a guiding rail 68 for guiding the movement of the transferring portion 65 along the screw shaft 67.

Figure 8A:
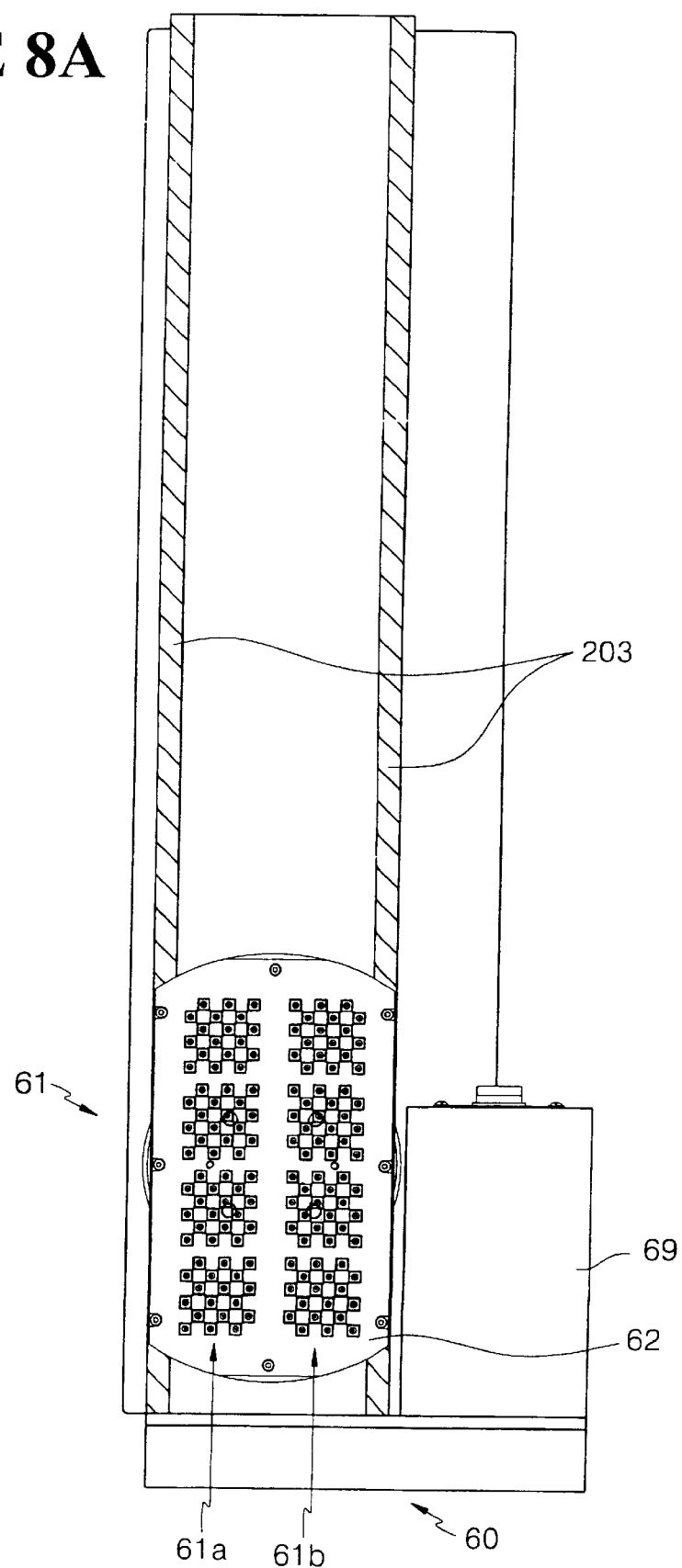
FIG. 8a depicts a top planar view of a package deposit unit in accordance with the present invention.
Figure 8B:
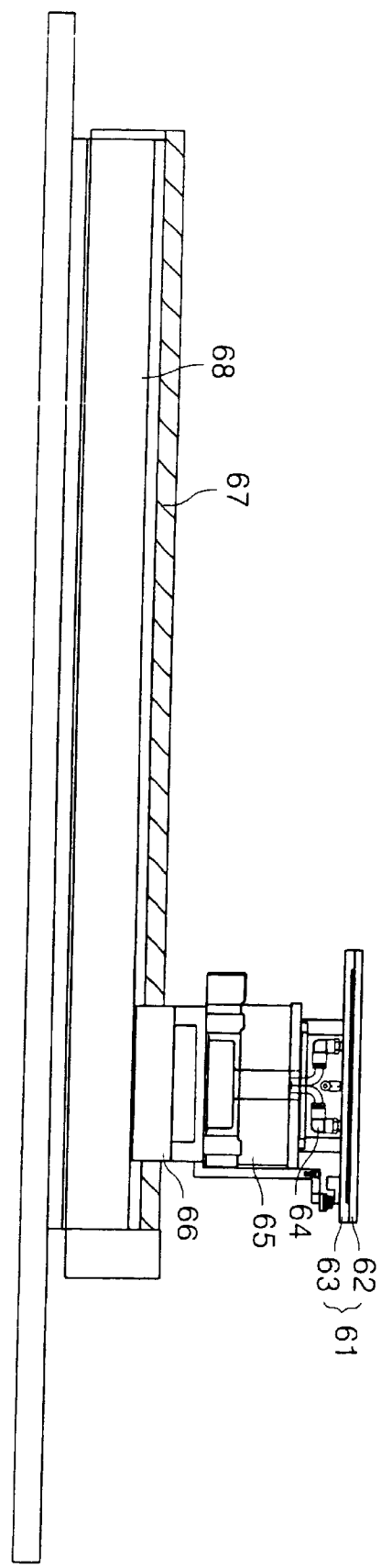
FIG. 8b depicts a right-side elevational view of the package deposit unit in accordance with the present invention.
Figure 8C:
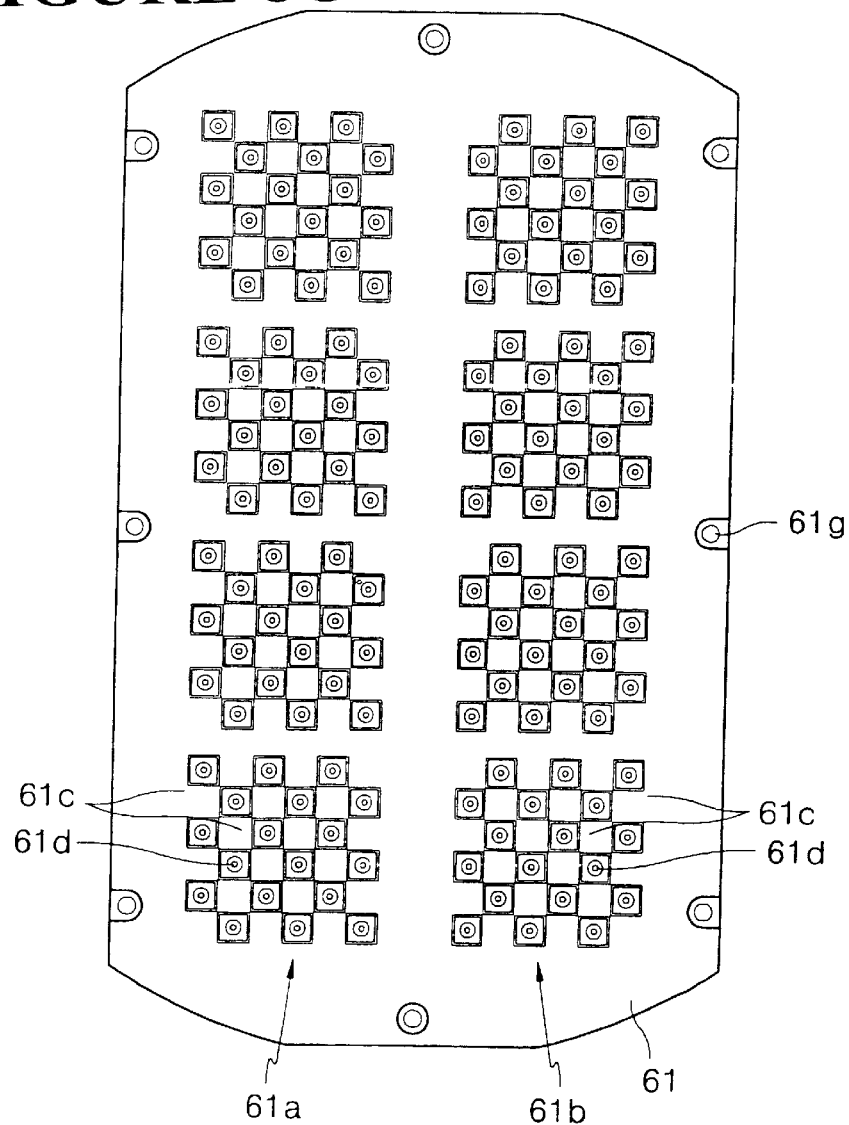
FIG. 8c presents a top planar view of a deposit plate of a package deposit table in accordance with the present invention.
Figure 8D:
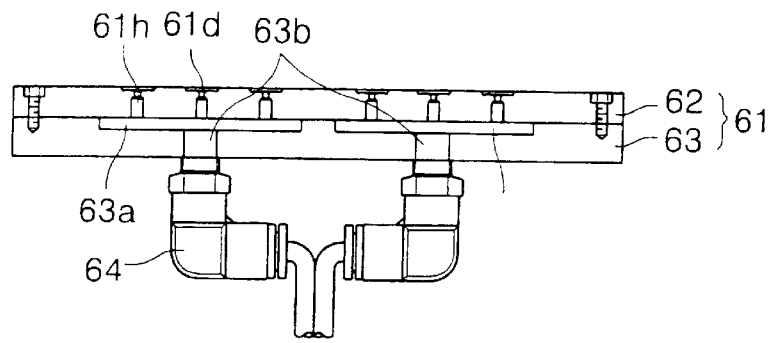
FIG. 8d presents a sectional view of the deposit plate of the package deposit table in accordance with the present invention.
Figure 8E:
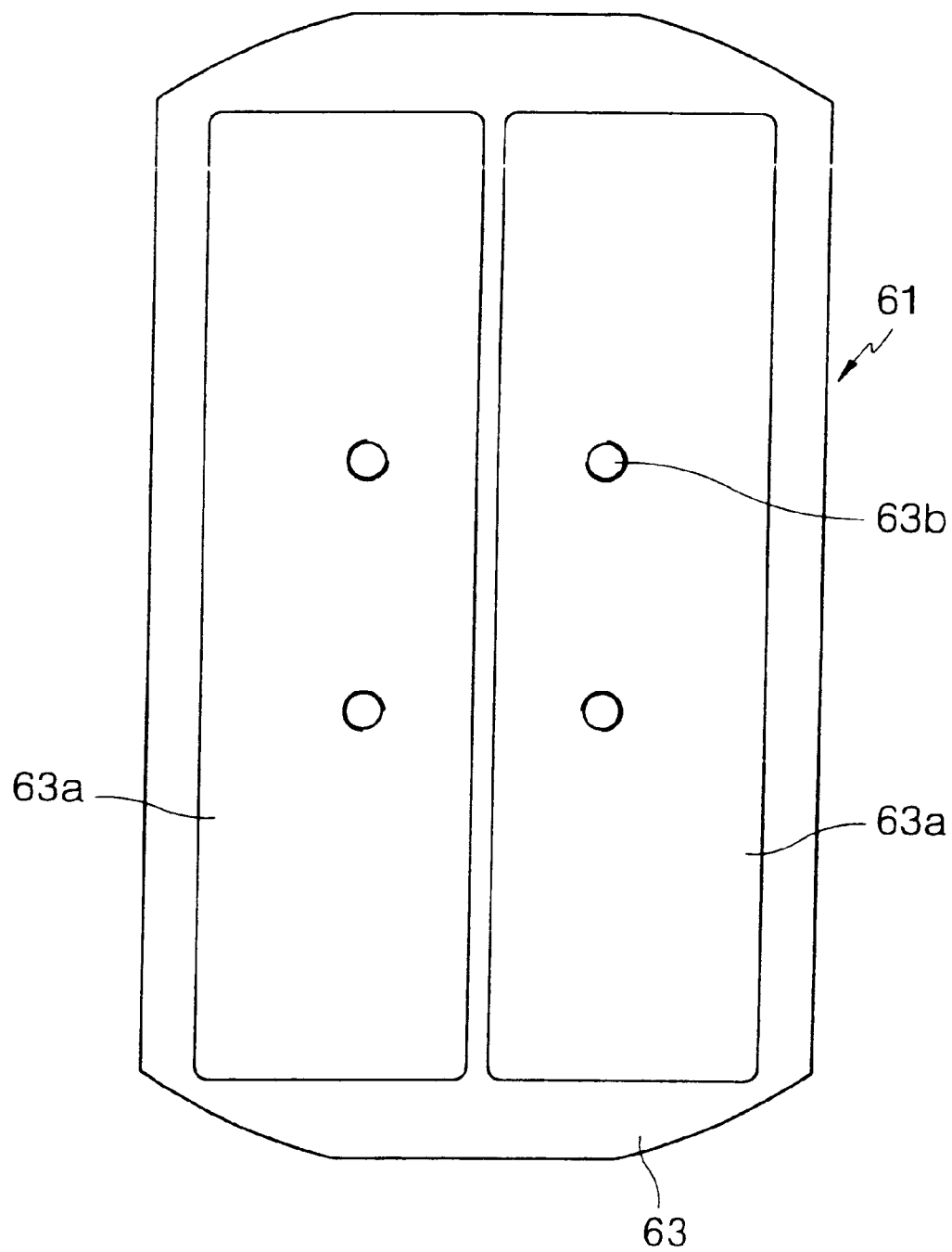
FIG. 8e depicts a top planar view of an auxiliary plate of the package deposit table in accordance with the present invention.

As shown in FIGS. 8c to 8e, the package deposit table 61 includes an upper deposit table 62 provided with a first and a second deposit places 61a, 66b on each of which a deposit zone on which the package device is positioned and a vacant zone on which the package device does not exist are alternatively arranged; and a lower deposit table 63 fixed with the bottom surface of the upper deposit table 62 via a plurality of fastening members 61g and having a plurality of vacuum holes 63b for guiding the vacuum pressure from the vacuum pipes 64, and vacuum recesses 63a of a predetermined sunken depth formed at an upper portion of the vacuum holes 63b.

Figure 8F:
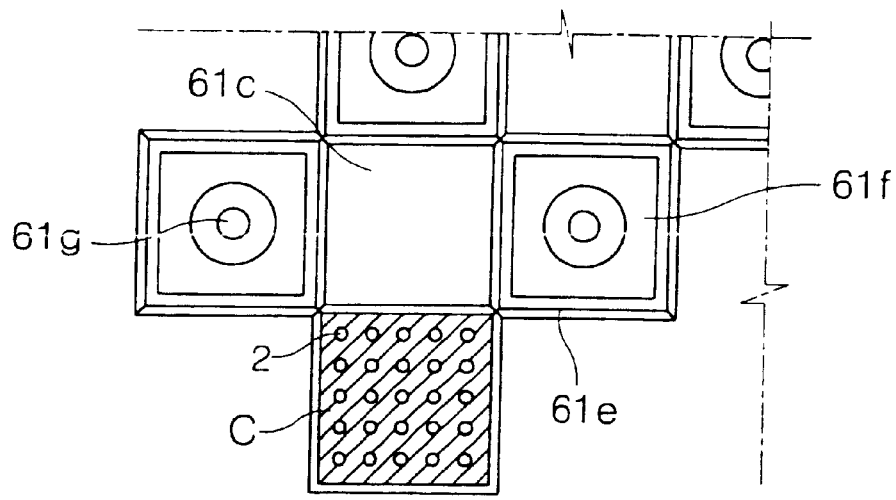
FIG. 8f discloses a top planar view of important parts of the package deposit table in accordance with the present invention.
Figure 8G:
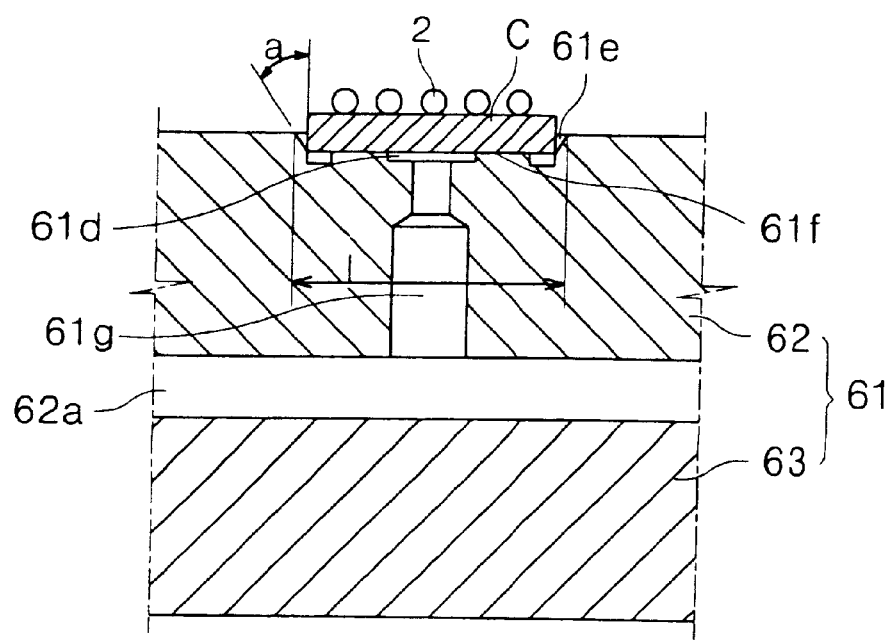
FIG. 8g represents a sectional view of the important parts of the package deposit table in accordance with the present invention.

As shown in FIGS. 8f and 8g, the upper deposit table 62 is provided with vacuum paths for an air supply each of which is formed through a center of the deposit zone 61d. An inclined portions 61e for locating the package device on the deposit zone 61d are formed along the periphery of the deposit zone 61d.

Meanwhile, the inclined portions 61e are formed on all four sides; and an angle of the inclination, preferably, ranges from 20 degree to 40 degree.

The fastening member 61g for fixing the upper deposit table 62 to the lower deposit table 63 may be a bolt or screw or the like.

As shown in FIGS. 9a and 9b, the package pick-up unit 70 includes a pair of picker heads 72 for retaining the package device C via a suction force in a manner to amend a suction position of the package device C located in particular positions; a pair of vertical transferring blocks 73 for vertically moving the picker heads 72 using fixing blocks 75 adapted to move along vertical guiding rails 74; a pair of air cylinders 71 for supplying an air to the picker heads 72; and a pair of horizontally guiding rails 77 for horizontally moving the package device C retained on the picker heads 72 by the suction force by using a rotation of a screw shaft 76.

The package tray unit 80 includes a tray deposit portion 82 on which the tray B is seated; a moving block 83 supporting the bottom portion of the tray deposit portion 82 and horizontally moving along a guiding rail 84; a motor 85 for generating a driving force to horizontally move the moving block 83; an air cylinder 81 for retaining the tray B seated on the tray deposit portion 82 via a vacuum suction force; a tray supplying portion 88 for supplying the tray B in which the package devices classified according to the quality are deposited; and a tray deposit cassette 89 for transferring the tray B supplied to the tray supplying portion 88 to the tray pick-up portion 55 of the package transferring unit 50 to be deposited thereon.

The operation of the present invention will now be described herein below.

As shown in FIG. 2a, in the on-loader unit 10a, the cassette 11 on which the strip A is deposited is moved rightward, when the motor 18 is rotated, rotating the rotating shaft 19a via the belt 18a, with the conveyor belt 19 being rotated.

After the cassette 11 is moved in a manner described above, the cassette 11 is grasped by the finger 15. At this time, when the elevating motor 12 is driven to rotate the screw 13, thereby allowing the nut 14 to be moved upwardly, the cassette 11 held by the finger 15 is also moved upwardly.

When the cassette 11 arrives at a predetermined position near the drawer picker 21 of the drawer unit 20, the strip pusher 17 is actuated to horizontally push the strip A positioned inside the cassette 11.

As shown in FIG. 3b, the strip A horizontally moved by the strip pusher 17 is guided by the pair of guiding rails 24 and is finally grasped by the drawer picker 21 of the drawer unit 20. The strip A grasped by the drawer picker 21 is horizontally additionally moved in response to the horizontal movement of the guiding member 21a which horizontally moves by the motor 23.

A visual inspection means for detect the kinds of the strips A and the orientation of the package device when the strips A are supplied to the drawer unit 20 is provided in the drawer unit 20.

Meanwhile, in order to properly guide the strip A according to the kinds of the strip A and the package device, the width between the guiding rails 24 is properly adjusted by rotating the width adjusting screw shaft 25 which is driven by the motor 26 via the belt 27.

As shown in FIG. 4b, the strip A which has been transferred to the drawer unit 20 from the on-loader unit 10a is then retained on the picker head 37 by using the suction portion 31 which applies the suction vacuum force from the vacuum port 39.

The reciprocating transferring member 35 with the strip A retained on the picker head 38 moves along the guide rail 36 to transfer the strip A to the cutting device D which will cut the strip A into the plurality of individual package devices.

Next, the package device C transferred by the picker head 37 of the strip transferring unit 30 is cut into the plurality of individual package devices by the cutting device D.

After the strip A has been cut into the plurality of individual package devices in the cutting device D, the latter are retained on the picker head 38 of the strip transferring unit 30 by the suction vacuum force. Then, the reciprocating transferring member 35 transfers the individual package devices to the cleaning unit 40.

On the other hand, the pair of picker heads 37, 38 are vertically moved by the vertical movement of the picker transferring member 32 which is achieved with a nut 33 connected to the motor 34.

The individual package devices C retained on the picker head 38 of the strip transferring unit 30 are seated on the upper plate 43 of the cleaning unit 40 under the cushioning function of the O-ring 42.

In the cleaning unit 40, in order to allow the alien material to be removed from the individual package devices C, the brush 44 fixed to the transferring block 46 which moves horizontally by the power source (not shown) is used. Further, a high pressurized air supplied to the air nozzle 45 through the air pipe 47 is applied to the individual package devices C to separate the alien material from the same which are retained on the picker head 38 of the strip transferring unit 30 by the suction vacuum force.

Next, the individual package devices C retained on the picker head 38 of the strip transferring unit 30 by the suction vacuum force is transferred to the upper plate 49b of the package drying unit 48 adjacent the cleaning unit 40. The individual package devices C are seated on the upper plate 49b.

In this situation, the heating member 49c mounted between the upper plate 49b and the main body of the drying unit 49 heats the individual package devices C in order to remove the humidity from the them. At the same time, the vacuum pressure from the vacuum path 49e further removes the remaining humidity on the individual package devices.

Next, the individual package devices from which the alien material and the humidity are removed in the cleaning unit 40 and the package drying unit 48 arrives at the package deposit unit 60.

The individual package devices C positioned on the upper plate 49b of the package drying unit 48 are transferred to the package deposit unit 60, being picked up by the suction vacuum force by the pick-up head 52 of the package pick-up portion 51 of the package transferring unit 50.

Next, half of the individual package devices C are released from the pick-up head 52 by partially stopping the suction vacuum force and then are retained and fixed on the deposit zone 61d of the first deposit place 61a of the upper deposit table 62 by the suction vacuum force.

Next, after the half of the individual package devices C are fixed on the first deposit place 61a, the package transferring unit 50 horizontally moves the pick-up head 52 to locate the pick-up head 52 above the second deposit place 66b.

Then, the suction vacuum force is not applied any longer by the pick-up head 52 and the remaining individual package devices C are then retained on the deposit zone 61d of the second deposit place 66b of the upper deposit table 62 by the suction vacuum force.

The suction vacuum force applied to the first and the second deposit places 61a, 66b is transmitted from a vacuum path 61h through the vacuum recess 63a, the vacuum hole 63b and the vacuum pipe 64.

During the individual package devices C are seated on the deposit zone 61d, the inclined portion 61e smoothly guides the package device C to enter into a proper position within the deposit zone, even if the package device C poses in inappropriate orientation.

Further, although a maximum width of the deposit zone 61d is longer than that in the prior art, the deposit zone 61d has the vacant zone 61c in its adjacent area, thereby preventing the adjacent deposit zones from being interfered with each other.

That is, in the present invention, the individual package devices C are alternatively positioned in the first and the second deposit places 61a, 66b.

As shown in FIG. 8g, since the angle a of the inclination of the inclined portions 61e ranges from 20 degree to 40 degree, it is possible for the individual package device to be smoothly seated.

When the individual package device C is seated on the deposit zone 61d, since a BGA(Ball Grid Array) 2 is positioned on an upside of the individual package device C and the bottom surface of the individual package device C comes into a contact with a contact surface portion 61f protruding above the deposit zone 61d, the suction vacuum force is efficiently applied to the package device C.

The deposit table 61 is horizontally moved along the deposit table guiding rail 68 by driving the driving motor 69 to rotate the screw shaft 67 whose rotation moves horizontally the nut member 66, before the package device C is deposited on the deposit table 61 or after the package device C has been deposited on the deposit table 61.

Next, the package pick-up unit 70 moves to the package deposit table 61 and then the package device C are retained on the pick-up head 72 by the suction vacuum force to be horizontally transferred. The pick-up head 72 is fixed to the vertically transferring block 73 moving along the vertical guiding rail 74 and is supplied with the negative air pressure from the air cylinder 71.

The rotation of the screw shaft 76 by the power source(not shown) horizontally moves the pick-up head 72 and the vertically transferring block 73 along the horizontal guiding rails 77.

The pick-up head 72 retaining the package devices C is transferred to the visual inspection means 90 shown in FIG. 1a along the horizontal guiding rails 77; and the package devices C are subject to an inspection where the condition of the package device, e.g., the result of the marking or chipping which determines the quality grade of the package device C are examined.

At this time, the individual package devices C retained on the pick-up head 72 are classified into e.g., a good state and a bad state, based on data of the predetermined quality standard which may be stored in a microprocessor(not shown) and then are separately transferred to the package tray deposit unit 80 mounted on one side of the visual inspection means 90.

In the package tray deposit unit 80, the individual package devices C retained on the pick-up head 72 are transferred to the plurality of tray deposit portion 82. According to the state of the individual package device C, the package devices C are separately deposited on the tray deposit portion 82 for the good state or the tray deposit portion 82 for the bad state.

That is, the package tray deposit unit 80 has the plurality of tray deposit portions 82 in order for a distinguished deposit based on the quality of the package device C.

On the other hand, after the package devices C are classified into the good state and the bad state by the visual inspection means 90, the tray B fixed on the tray deposit portion 82 by the air cylinder 81 is moved along the guiding rail 84 for the selective deposition of the package device classified into the good state and the bad state.

Next, the package transferring unit 50 approaches the tray B on which the package devices are deposited and holds the tray B through the tray pick-up portion 55 having the tray clamp 54 holding the sides of the tray B, depositing the tray B vertically in the tray deposit cassette 89 of the tray supplying portion 99. The vacant tray B is positioned again on the tray deposit portion 82. These operations are repeated. With this manner described, cutting the strip, cleaning and drying the package device, seating the package device on deposit table, inspecting the package device and classifying the package device, and selectively depositing the classified package device constitutes one cycle of the process.

Consequently, by the inventive handler system, a semi-finished product on which a plurality of packages are arranged and strips can be easily cut by a cutting device, e.g., a sawing machine, and a quality inspection is performed to find an inferior one after each of the separated package devices is cleaned and dried, so that the package devices can be separately deposited on a basis of the inspection result, whereby the manufacturing of the semiconductor package device is efficiently processed.

Although the invention has been shown and described with respect to the preferred embodiments, it will be understood by those skilled in the art that various changes and modifications may be made without departing from the spirit and scope of the invention as defined in the following claims.

What is claimed is:

1. A handler system for cutting semiconductor package devices in a manner to selectively deposit the package devices according to a quality of the package devices, comparing with a predetermined quality grade, after an individual single package device is obtained by cutting a semi-finished product of a semiconductor or a strip in a cutting device, the system comprising:

an on-loader unit for loading at least one of the strips deposited in a cassette;

a drawer unit for holding the strip from the on-loader unit at a drawer picker;

a strip transferring unit for fixing in a suction manner the strip held by the drawer unit to a picker head of the strip transferring unit for transferring the strip to a cutting device in which the strip is cut into a plurality of individual package devices;

a package cleaning unit for cleaning the individual package devices using a brush and an air nozzle after a picker head for fixing the individual package devices retaining the individual package devices thereon by using a suction vacuum force;

a package drying unit for drying the individual package devices after the individual package devices are cleaned by the cleaning unit;

a package transferring unit for vacuum absorbing and moving the individual package devices dried by the package drying unit;

a package deposit unit for moving and depositing the individual package devices transferred by the package transferring unit;

a package pick-up unit for retaining the individual package devices thereon by using the suction vacuum force and for arranging the individual package devices for a quality inspection of the individual package devices, the package pick-up unit mounted on one side of the package deposit unit;

a visual inspection means for inspecting the quality of the individual package devices being retained on a pick-up head of the package pick-up unit; and a package tray deposit unit for retaining the individual package devices thereon by using the suction vacuum force to seat the individual package devices on the package deposit unit, the package tray deposit unit for transferring the tray on which the individual package devices classified based on the inspection result are contained.

2. The handler system of claim 1, wherein said on-loader unit includes a finger for holding the cassette at both ends of the cassette; a conveyor belt being rotated by a rotating shaft to horizontally move the cassette; a motor being coupled to the rotating shaft via a belt; an elevating motor for rotating a screw engaged with a nut to vertically move the finger relative to a fixed shaft; a guiding member and a guiding rail for horizontally moving the cassette held by the finger; and a strip pusher for pushing the strip deposited on the cassette toward the drawer picker of the drawer unit.

3. The handler system of claim 1, wherein said drawer unit includes a pair of guiding rails for guiding both sides of the strip being moved by the drawer picker retaining the strip; a width adjusting screw shaft for adjusting a width between the rails; a guiding member supporting the drawer picker and transferring the same to a position of a strip pick-up; and a motor for guiding the movement of the guiding member to guide the drawer picker.

4. The handler system of claim 1, wherein said strip transferring unit includes a suction portion formed with the pair of picker heads for retaining thereon the strip before the cutting process and the individual package devices, respectively, by a suction vacuum force; a vacuum port for providing the suction portion with a vacuum pressure; a picker transferring member for vertically moving the suction portion to allow the suction portion to be closely contacted on the strip; and a reciprocating transferring member for horizontally reciprocally moving each of the individual package devices separated by cutting the strip retained on the suction portion of the picker head by the cutting device.

5. The handler system of claim 1, wherein said package cleaning unit includes an upper plate on which the package devices retained on the picker head of the strip transferring unit are seated; an air pipe for emitting air to the package devices seated on the upper plate through an air nozzle; and the transfer block having a power means for horizontally moving the brush and the transfer block.

6. The handler system of claim 5, wherein an O-ring is formed along an edge in order to absorb a shock occurring when the packaged device is seated on the upper plate.

7. The handler system of claim 1, wherein said package drying unit includes an upper plate on which the package device from which alien material is removed in the package cleaning unit is seated to be retained by a suction force through a vacuum suction hole; a heating member mounted between the upper plate and a main body of the drying unit to heat at a high temperature the package device retained on the upper plate by the vacuum suction force; and a vacuum path for applying a vacuum of a high negative pressure to the package device retained on the upper plate by the suction force to remove the humidity from the package device.

8. The handler system of claim 1, wherein said package transferring unit includes a package pick-up portion for picking up the package device by using a pick-up head, from which the alien material is removed in the cleaning unit and the drying unit; and a tray pick-up portion for holding the tray using a tray clamp to supply the tray on which the plurality of the package devices are picked up by the package pick-up portion.

9. The handler system of claim 1, wherein a package quality inspection means for inspecting the quality of the package devices is mounted on one side of the package transferring unit.

10. The handler system of claim 1, wherein said package deposit unit includes a package deposit table on which the package devices are captured by a vacuum suction force and deposited with separation therebetween; a plurality of vacuum pipes being connected to a vacuum source beneath the package deposit table to provide a high vacuum pressure; a transferring portion supporting a lower surface of the package deposit table and having a nut at a lower portion of the transferring portion; a screw shaft being coupled to the nut and being rotated by a driving motor to horizontally transfer the transferring portion to a predetermined position; and a guiding rail for guiding the movement of the transferring portion along the screw shaft.

11. The handler system of claim 10, wherein said package deposit table includes an upper deposit table provided with a first and a second deposit places on each of which a deposit zone on which the package device is positioned and a vacant zone on which the package device does not exist are alternatively arranged; and a lower deposit table fixed with a bottom surface of the upper deposit table via a plurality of fastening members and having a plurality of vacuum holes for guiding the vacuum pressure from the vacuum pipes, and vacuum recesses of a predetermined sunken depth formed at an upper portion of the vacuum holes.

12. The handler system of claim 11, wherein said upper deposit table is provided with vacuum paths for an air supply, each vacuum path is formed through a center of the deposit zone and an inclined portions for locating the package device on the deposit zone are formed along the periphery of the deposit zone.

13. The handler system of claim 12, wherein said inclined portions are formed on all four sides; and an angle of the inclination ranges from 20 degree to 40 degree.

14. The handler system of claim 11, wherein said fastening member for fixing the upper deposit table to the lower deposit table is a bolt or screw.

15. The handler system of claim 1, wherein said package pick-up unit includes a pair of picker heads for retaining the package device via a suction force in a manner to amend a suction position of the package device located in particular positions; a pair of vertical transferring blocks for vertically moving the picker heads using fixing blocks adapted to move along vertical guiding rails; a pair of air cylinders for supplying air to the picker heads; and a pair of horizontal guiding rails for horizontally moving the package device retained on the picker heads by the suction force by using a rotation of a screw shaft.

16. The handler system of claim 1, wherein said package tray unit includes a tray deposit portion on which the tray is seated; a moving block supporting a bottom portion of the tray deposit portion and horizontally moving along a guiding rail; a motor for generating a driving force to horizontally move the moving block; an air cylinder for retaining the tray seated on the tray deposit portion via a vacuum suction force; a tray supplying portion for supplying the tray in which the package devices classified according to the quality are deposited; and a tray deposit cassette for transferring the tray supplied to the tray supplying portion to the tray pick-up portion of the package transferring unit to be deposited thereon.

* * * * *